United States Patent
Takahashi et al.

(10) Patent No.: US 11,894,852 B2
(45) Date of Patent: Feb. 6, 2024

(54) THERMOSTATIC TYPE CRYSTAL OSCILLATOR

(71) Applicant: MAXIS-01 CORPORATION, Tokyo (JP)

(72) Inventors: Noboru Takahashi, Tokyo (JP); Ryo Kobayashi, Tokyo (JP); Yukihiro Okamoto, Hyogo (JP)

(73) Assignee: MAXIS-01 CORPORATION, Tokyo (JP)

( * ) Notice: Subject to any disclaimer, the term of this patent is extended or adjusted under 35 U.S.C. 154(b) by 0 days.

(21) Appl. No.: 18/167,459

(22) Filed: Feb. 10, 2023

(65) Prior Publication Data

US 2023/0188141 A1 Jun. 15, 2023

Related U.S. Application Data

(63) Continuation of application No. PCT/JP2021/026012, filed on Jul. 9, 2021.

(30) Foreign Application Priority Data

Aug. 31, 2020 (JP) ................... 2020-145664

(51) Int. Cl.
*H03L 1/02* (2006.01)
*H03L 1/04* (2006.01)

(52) U.S. Cl.
CPC ............... *H03L 1/028* (2013.01); *H03L 1/04* (2013.01)

(58) Field of Classification Search
CPC ........... H03L 1/028; H03L 1/04; H01L 23/38; H03B 5/32
See application file for complete search history.

(56) References Cited

U.S. PATENT DOCUMENTS

| 2007/0044565 A1 | 3/2007 | Aratake |
| 2015/0280101 A1* | 10/2015 | Kondo ................. H03H 9/1021 310/341 |
| 2018/0302032 A1* | 10/2018 | Oya .................... H03H 9/02086 |

FOREIGN PATENT DOCUMENTS

| JP | 2007-089117 A | 4/2007 |
| JP | 2007-300394 A | 11/2007 |
| JP | 2009-302701 A | 12/2009 |
| JP | 2014146958 A | 8/2014 |
| JP | 2016-158060 A | 9/2016 |
| JP | 2016-174265 A | 9/2016 |

* cited by examiner

Primary Examiner — Jeffrey M Shin
(74) Attorney, Agent, or Firm — WCF IP

(57) ABSTRACT

Provided is a thermostatic type crystal oscillator with short operation stabilization time and low power consumption. A thermostatic type crystal oscillator according to the present invention includes a crystal resonator including an IT-cut crystal blank, a vibration control circuit configured to control a vibration frequency of the crystal resonator, a temperature regulator configured to regulate a temperature of the crystal resonator within a set temperature range by repeating heating and cooling to the crystal resonator, a heat conducting plate configured to function as a heat absorbing plate and a heat dissipating plate for the temperature regulator, a temperature control circuit configured to control a temperature of the temperature regulator, and a housing that accommodates the crystal resonator. The housing defines a resonator accommodating space in which the crystal resonator is accommodated inside the housing.

19 Claims, 9 Drawing Sheets

FIG. 8
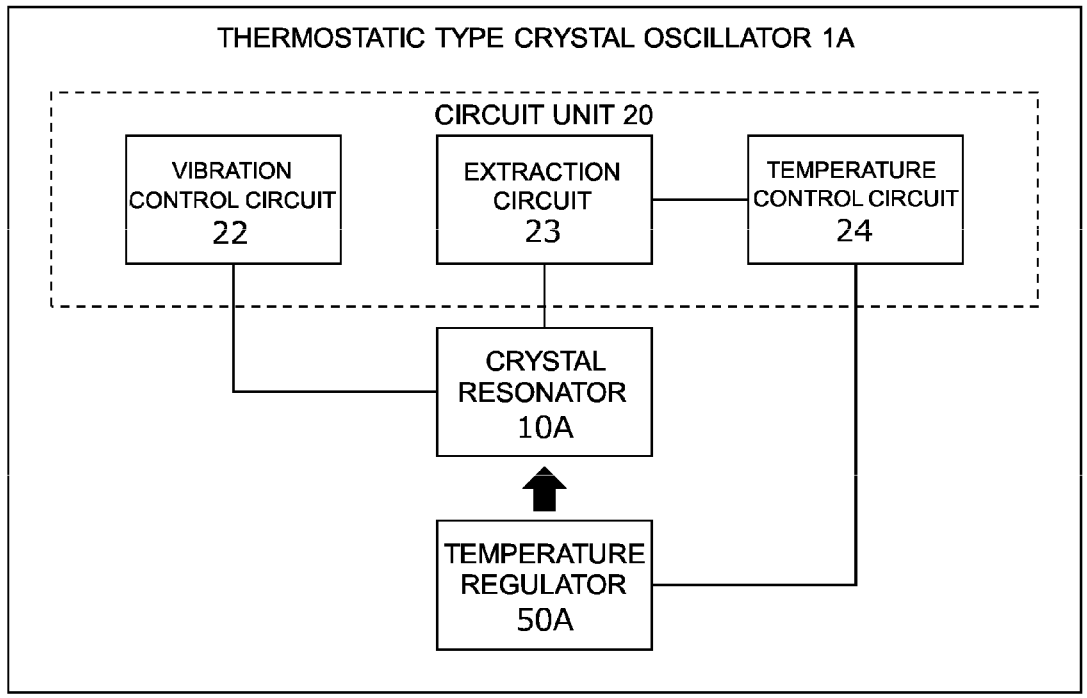
FIG. 9
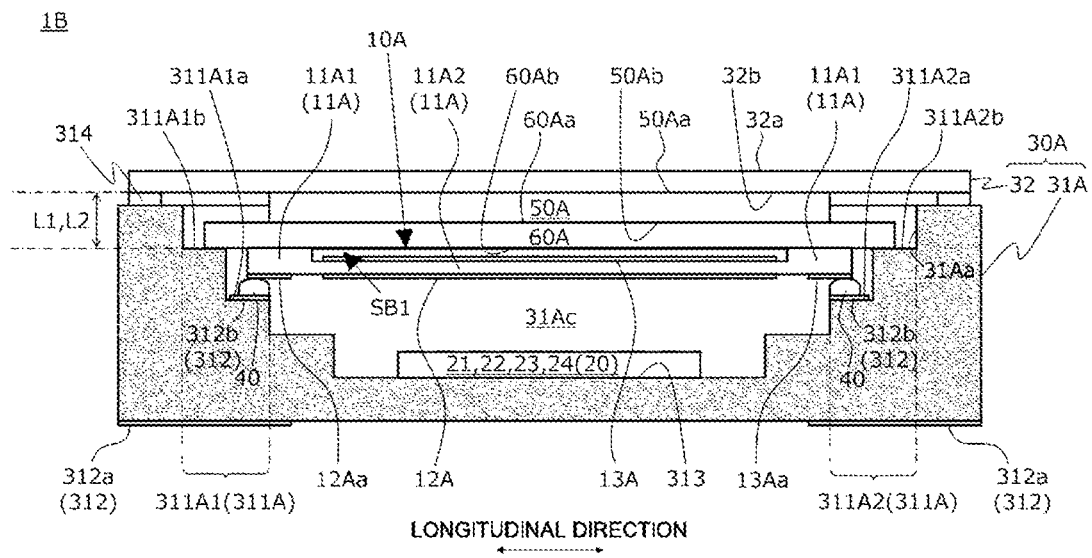
FIG. 10

THERMOSTATIC TYPE CRYSTAL OSCILLATOR

TECHNICAL FIELD

The present invention relates to a thermostatic type crystal oscillator.

BACKGROUND ART

In recent years, lower phase noise and lower jitter of oscillators (e.g., oscillators for base stations) have been demanded in order to improve communication performance due to increasing communication speed and communication capacity in next-generation communication devices from post 5G to 6G. In particular, a crystal oscillator with low phase noise and high frequency is needed to obtain low jitter GHz-band signals.

Among crystal oscillators, an oven-controlled crystal (X-tal) oscillator (OCXO) has excellent frequency accuracy, frequency-temperature stability, and the like. Thus, the OCXO is used for many applications in conventional communication devices and is an essential crystal oscillator for the next-generation communication devices.

A conventional OCXO has a structure in which a crystal unit including a crystal resonator accommodated in a housing and an oscillation circuit are accommodated in a thermostatic oven (a housing for thermostatic oven) in order to prevent a vibration frequency of the crystal unit from fluctuating in response to changes in ambient temperature (environmental temperature) (for example, see PTL 1). The temperature in the thermostatic oven is maintained at a predetermined temperature with a heater accommodated in the thermostatic oven. The crystal unit of which crystal has a double-rotation-cut (e.g., SC cut, IT cut) quartz crystal, which has excellent thermal shock properties, is widely used in the OCXO.

Herein, an SC-cut crystal unit has a temperature characteristic with a cubic curve in which an inflection point temperature ($T_i$) is approximately 95° C. and a peak temperature ($T_0$) indicating zero temperature coefficient on a lower temperature side of the inflection point temperature is approximately 70° C. to 80° C. Accordingly, the temperature in the thermostatic oven is controlled near the peak temperature, and thus the SC-cut crystal unit vibrates at a stable frequency (e.g., ±10 ppb).

However, in the conventional OCXO, the crystal unit, the oscillator circuit, and the heater are accommodated in the thermostatic oven. That is, the crystal resonator is doubly accommodated by the housing and the thermostatic oven. Thus, external dimensions of the OCXO tend to be larger (e.g., 15 mm long, 10 mm wide and 6 mm high) than external dimensions of a typical crystal oscillator.

In the conventional OCXO, the temperature in the thermostatic oven is controlled by heating with the heater. Thus, a controlled temperature range is set to a temperature close to an upper limit temperature in an operation temperature range of the OCXO and to a high temperature near the peak temperature (approximately 70° C. to 80° C.). Accordingly, a period from powering on to reaching a stable operation of the OCXO (an operation stabilization time) is long (e.g., approximately 20 min to 30 min), and power consumption is also large (e.g., approximately 1 W to 3 W at startup and approximately 0.5 W to 1 W at the stable operation). Furthermore, the members accommodated in the thermostatic oven (e.g., the crystal unit, the oscillator circuit, and the like) are exposed to the high temperature, and thus material life of the circuit and the like tends to be shortened and material costs tend to increase.

CITATION LIST

Patent Literature

[PTL 1] JP2016-174265 A

SUMMARY OF INVENTION

Technical Problem

An object of the present invention is to provide a thermostatic type crystal oscillator with short operation stabilization time and low power consumption.

Solution to Problem

A thermostatic type crystal oscillator according to the present invention includes: a crystal resonator including an IT-cut crystal blank; a vibration control circuit configured to control a vibration frequency of the crystal resonator; a temperature regulator configured to regulate a temperature of the crystal resonator within a set temperature range by repeating heating and cooling to the crystal resonator; a heat conducting plate configured to function as a heat absorbing plate and a heat dissipating plate for the temperature regulator; a temperature control circuit configured to control a temperature of the temperature regulator; and a housing that accommodates the crystal resonator, in which the housing defines, inside the housing, a resonator accommodating space in which the crystal resonator is accommodated.

Advantageous Effects of Invention

The present invention is able to provide the thermostatic type crystal oscillator with short operation stabilization time and low power consumption.

BRIEF DESCRIPTION OF DRAWINGS

FIG. 3A is a schematic diagram illustrating the cutting angle in a first rotation, and FIG. 3B is a schematic diagram illustrating the cutting angle in a second rotation.

FIG. 8 is a schematic cross-sectional view of the thermostatic type crystal oscillator illustrating another embodiment of the thermostatic type crystal oscillator according to the present invention.

FIG. 9 is a functional block diagram of the thermostatic type crystal oscillator in FIG. 8.

FIG. 10 is a schematic cross-sectional view of the thermostatic type crystal oscillator illustrating a first modification example of the thermostatic type crystal oscillator in FIG. 8.

DESCRIPTION OF EMBODIMENTS

A thermostatic type crystal oscillator according to the present invention (hereinafter referred to as "present oscillator") will be described with reference to the following embodiments and drawings.

In the following description, the "thermostatic type crystal oscillator" according to the present invention is an oscillator having a frequency-temperature stability equivalent to that of a conventional oven-controlled crystal oscillator (OCXO) without using a thermostatic oven (a housing for thermostatic oven) that accommodates a crystal unit (a crystal unit including a crystal resonator and a housing for accommodating the crystal resonator) and maintains the crystal unit at a constant temperature as is the case in the conventional OCXO. That is, the present oscillator is a crystal oscillator that does not have a double housing (two housings) included in the conventional OCXO, and a space in which the crystal resonator is accommodated (a resonator accommodating space described later) and external environmental space are divided by only a single housing (having a single housing). In the following description, the thermostatic type crystal oscillator will be referred to as present OCXO for convenience of description.

In the following description, "a state in which two members abut on each other" includes a state in which the two members are directly in contact with each other and a state in which the two members are bonded with an adhesive (a state in which a thin adhesive layer is formed between the two members).

Thermostatic Type Crystal Oscillator (1)

Figure 1:
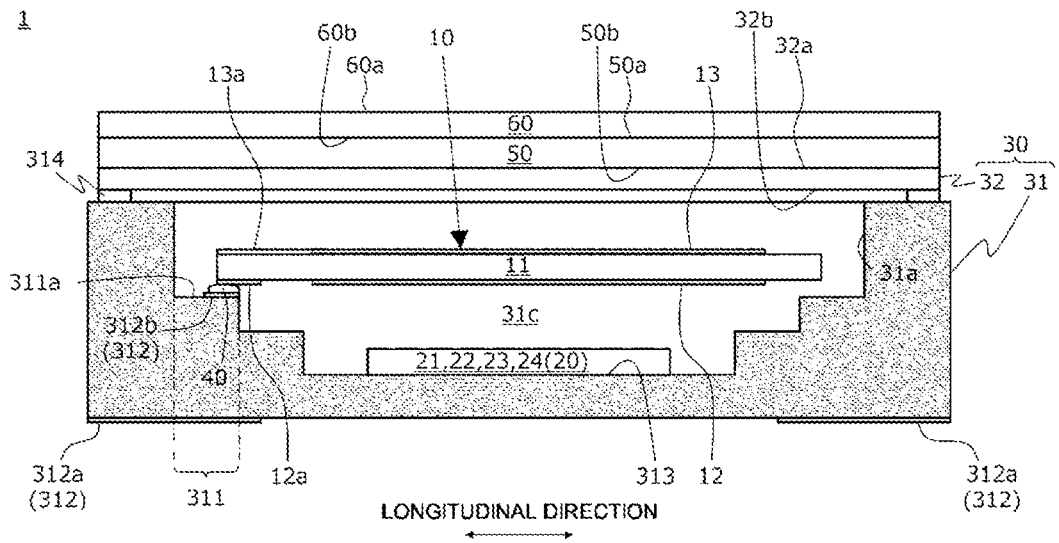
FIG. 1 is a schematic cross-sectional view of a thermostatic type crystal oscillator illustrating an embodiment of the thermostatic type crystal oscillator according to the present invention.

FIG. 1 is a schematic cross-sectional view of the present oscillator illustrating the embodiment of the present oscillator.

Figure 2:
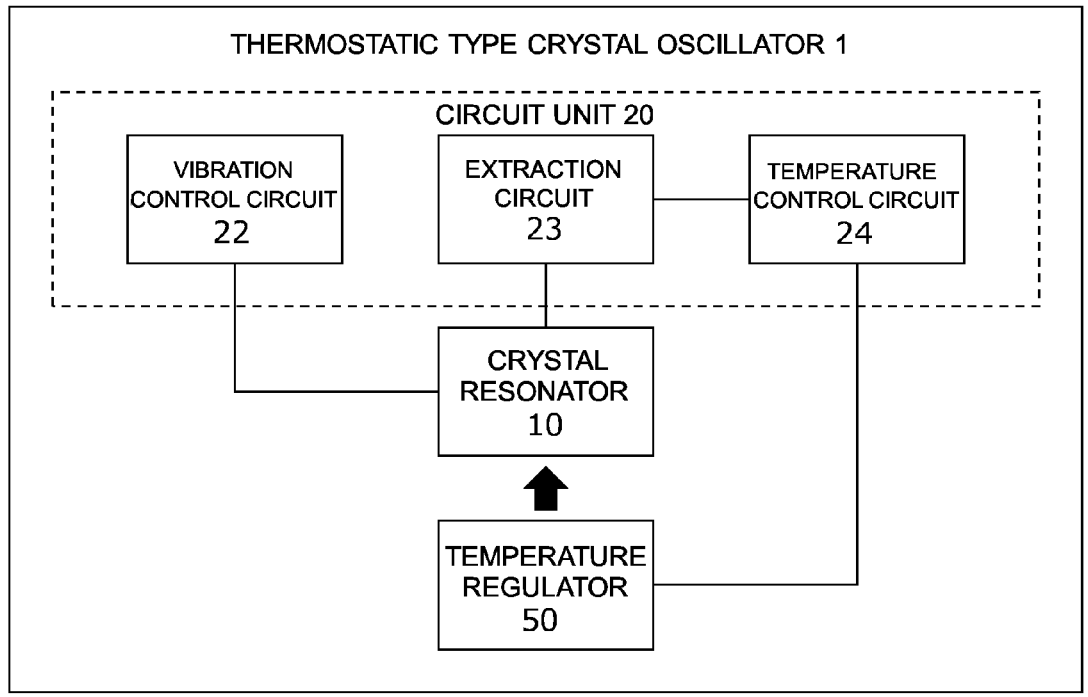
FIG. 2 is a functional block diagram of the thermostatic type crystal oscillator in FIG. 1.

FIG. 2 is a functional block diagram of the present oscillator.

A present oscillator 1 is a surface mount device (SMD) type thermostatic type crystal oscillator (present OCXO) that generates a signal of a predetermined oscillation frequency. The present oscillator 1 includes a crystal resonator 10, a circuit unit 20, a housing 30, a conductive adhesive 40, a temperature regulator 50, and a heat conducting plate 60.

The crystal resonator 10 generates a signal of a predetermined oscillation frequency. The crystal resonator 10 is accommodated in a resonator accommodating space 31c described later. The crystal resonator 10 includes a crystal blank 11, a first main surface electrode 12, and a second main surface electrode 13.

The crystal blank 11 is an IT-cut (a double rotation cut) crystal blank. That is, the crystal resonator 10 is an IT-cut crystal resonator. The IT cut is a well-known technique, and the description thereof is omitted. The crystal blank 11 has a rectangular plate shape with a short side and a long side in a plan view, for example.

In the following description, a direction parallel to the short side of the crystal blank 11 (the front-back direction in FIG. 1) is a lateral direction, and a direction parallel to the long side of the crystal blank 11 (the left-right direction in FIG. 1) is a longitudinal direction. When the present oscillator 1 is mounted on a substrate (not illustrated), a direction to the substrate side with respect to the present oscillator 1 is downward and a direction opposite to downward is upward.

Figure 3:
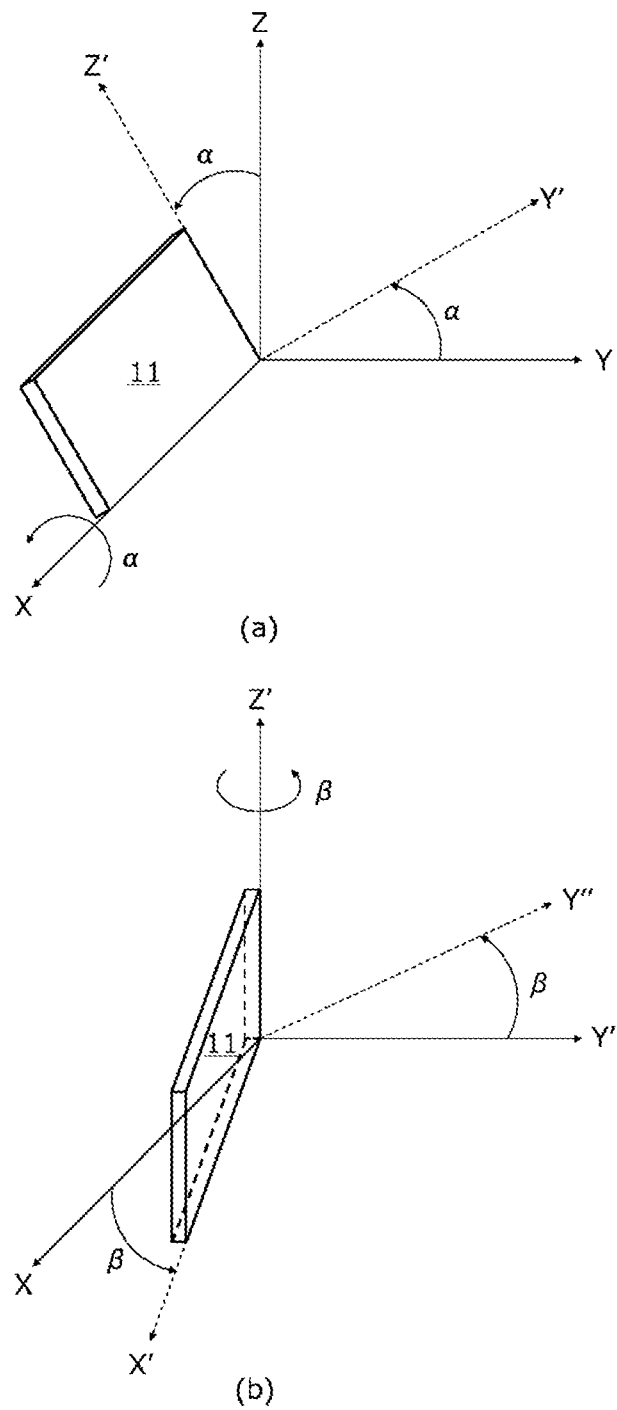
FIG. 3 is a diagram illustrating a cutting angle of a quartz crystal of a crystal blank included in the thermostatic type crystal oscillator in FIG. 1.

FIG. 3 is a schematic diagram illustrating a cutting angle of a quartz crystal of the crystal blank 11. FIG. 3A is a schematic diagram illustrating the cutting angle in a first rotation, and FIG. 3B is a schematic diagram illustrating the cutting angle in a second rotation.

The figure illustrates that the crystal blank 11 is cut at a cutting angle where, in an orthogonal coordinate system (XYZ) of the quartz crystal, a plane perpendicular to the XZ-axis is rotated by "α" degrees (single rotation) having the X axis being an electrical axis as a rotation axis, and, in an orthogonal coordinate system (XY'Z') after the rotation by "α" degrees, the plane is rotated by "β" degrees (double rotation) having the Z' axis as the rotation axis. In the present embodiment, the crystal blank 11 is cut at a cutting angle of "α" being 34 degrees 25 minutes 30 seconds and "β" being 19 degrees 6 minutes, for example.

Figure 4:
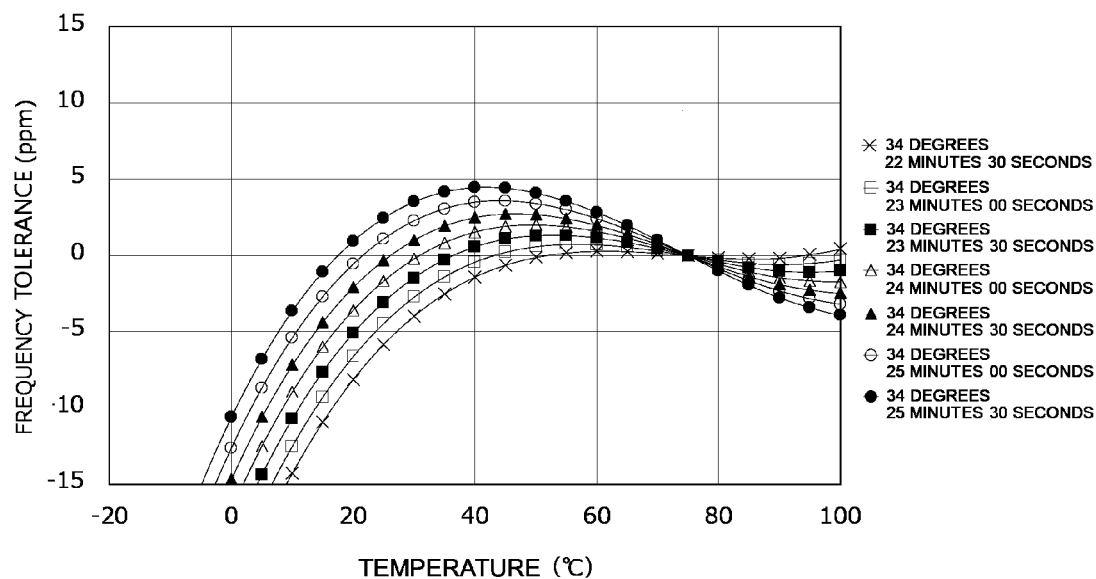
FIG. 4 is a graph illustrating a frequency temperature characteristic of a crystal resonator included in the thermostatic type crystal oscillator in FIG. 1.

FIG. 4 is a graph illustrating a frequency temperature characteristic of the crystal resonator 10 using the crystal blank 11.

The figure illustrates a frequency tolerance (ppm) on a vertical axis and temperature (° C.) on a horizontal axis. The figure illustrates the frequency temperature characteristic of the crystal resonator 10 when "β" is fixed at 19 degrees 6 minutes, and "α" is increased at 30 second intervals from 34 degrees 22 minutes 30 seconds. The figure illustrates that the inflection point temperature $T_i$ of the crystal resonator 10 is approximately 75° C., and that the peak temperature $T_0$ indicating the zero temperature coefficient on the lower temperature side of the inflection point temperature $T_i$ fluctuates in a range of approximately 60° C. to 40° C. as "β" increases.

In this way, the cutting angle is adjusted, thereby setting the peak temperature $T_0$ of the crystal resonator 10 in a range of 30° C. to 50° C., preferably in a range of 35° C. to 45° C., and more preferably in a range of 40° C. to 45° C.

Figure 5:
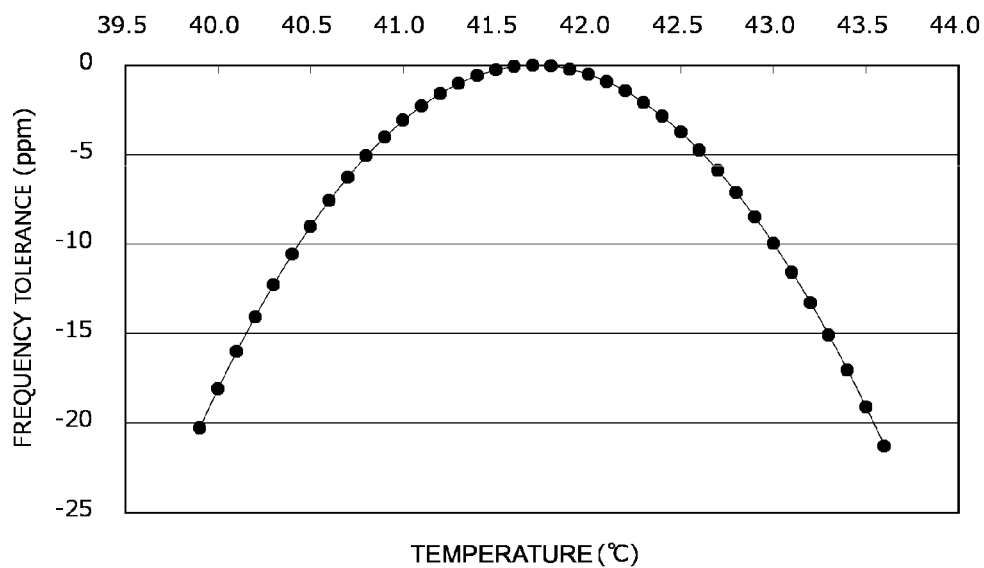
FIG. 5 is another graph illustrating the frequency temperature characteristic of the crystal resonator included in the thermostatic type crystal oscillator in FIG. 1.

FIG. 5 is another graph illustrating the frequency temperature characteristic of the crystal resonator 10.

The figure illustrates the frequency tolerance (ppm) on a vertical axis and temperature (° C.) on a horizontal axis. The figure illustrates that the peak temperature $T_0$ of the crystal resonator 10 using the crystal blank 11 cut at the cutting angle of "α" being 34 degrees 25 minutes 30 seconds and "β" being 19 degrees 6 minutes is approximately 42° C.

Referring back to FIG. 1 and FIG. 2, each of the first main surface electrode 12 and the second main surface electrode 13 applies a predetermined voltage to the crystal blank 11. The first main surface electrode 12 is disposed on one side surface of the crystal blank 11 (a surface on the lower side in FIG. 1: lower surface). The second main surface electrode 13 is disposed on another side surface of the crystal blank 11 (a surface on the upper side in FIG. 1: upper surface). Each of the first main surface electrode 12 and the second main surface electrode 13 includes a Cr film that is an underlying metal film and an Au film that is a metal film disposed on the underlying metal film, for example.

The crystal blank 11, the first main surface electrode 12, and the second main surface electrode 13 are formed by a known photolithography process, for example.

The circuit unit 20 constitutes a circuit group required for operation of the present oscillator 1. The circuit unit 20 is accommodated in a resonator accommodating space 31c described later. The circuit unit 20 includes a circuit board 21, a vibration control circuit 22, an extraction circuit 23, and a temperature control circuit 24, for example.

The circuit board 21 is a substrate on which the vibration control circuit 22, the extraction circuit 23, and the temperature control circuit 24 are mounted.

The vibration control circuit 22 controls a vibration frequency of the crystal resonator 10. The vibration control circuit 22 is a known oscillation circuit, for example.

The extraction circuit 23 extracts a B-mode signal of the crystal resonator 10. The extraction circuit 23 extracts the B-mode signal of the single crystal resonator 10 in a known manner, for example. The crystal blank 11 is an IT-cut crystal blank. Thus, a vibration mode of the crystal resonator 10 includes a thickness shear vibration mode (C mode) that is main vibration and a thickness torsional vibration mode (B mode) that is sub vibration.

Figure 6:
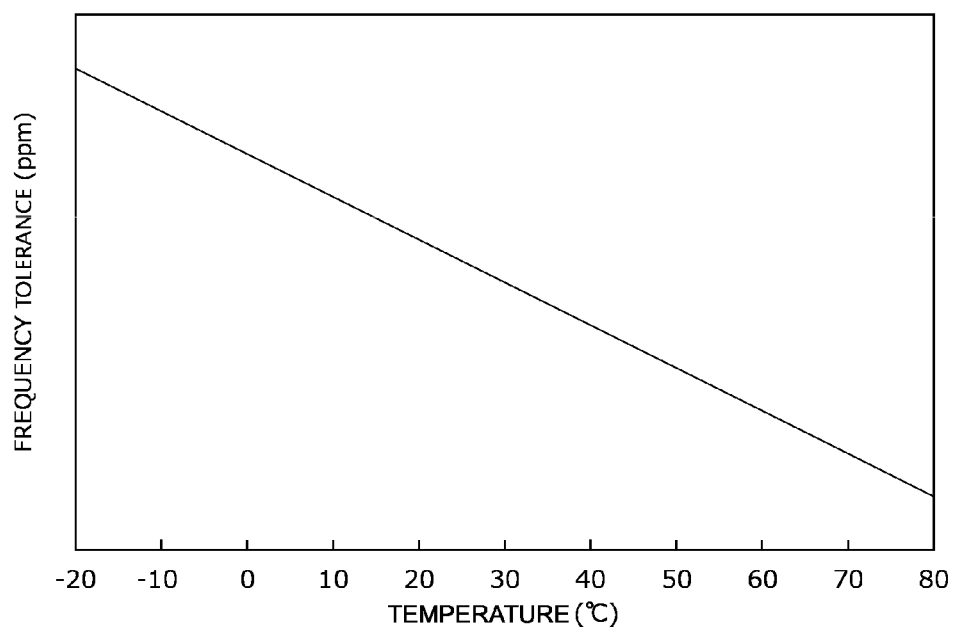
FIG. 6 is a graph schematically illustrating a frequency temperature characteristic of a B mode of the crystal resonator included in the thermostatic type crystal oscillator in FIG. 1.

FIG. 6 is a graph schematically illustrating a frequency temperature characteristic of the B mode of the IT-cut crystal resonator 10. The figure illustrates the frequency tolerance (ppm) on a vertical axis and temperature (° C.) on a horizontal axis. The figure illustrates that a frequency in the frequency temperature characteristic of the B mode varies linearly with respect to temperature change.

Referring back to FIG. 1 and FIG. 2, the temperature control circuit 24 controls a current supplied to the temperature regulator 50, based on the B-mode signal extracted by the extraction circuit 23. Specifically, the temperature control circuit 24 detects temperature of the crystal resonator 10, based on the B-mode signal, and controls the current (direction and magnitude of the current) supplied to the temperature regulator 50 so that the temperature of the crystal resonator 10 becomes a predetermined temperature (e.g., a peak temperature $T_0$).

The housing 30 accommodates the crystal resonator 10 and the circuit unit 20. The housing 30 includes a base 31 and a cover 32. The housing 30 is a known housing for the crystal oscillator having external dimensions with a length of 2.5 mm, a width of 2.0 mm, and a height of 0.9 mm, for example.

The base 31 is a sintered body in which a plurality of ceramic layers such as alumina, for example, is laminated. The base 31 has a rectangular shape in a plan view (viewed from the top) and has a box shape with an opening portion 31a opening upward. That is, a space in which the crystal resonator 10 and the circuit unit 20 are accommodated (a resonator accommodating space (a cavity) 31c) is defined in the base 31. The base 31 includes a stepped portion 311, an electrode terminal 312, a recess portion 313, and a seal ring 314. In the present embodiment, the base 31 has external dimensions with a length of 2.5 mm and a width of 2.0 mm, for example.

The stepped portion 311 is a portion on which the crystal resonator 10 is mounted. The stepped portion 311 is disposed on an upper surface on one side (on the left side in FIG. 1) of a bottom portion of the base 31 in the longitudinal direction. The electrode terminal 312 includes external terminals 312a disposed on a lower surface of the bottom portion of the base 31 and a pair of electrode terminal pads 312b disposed on the upper surface (hereinafter referred to as "mounting surface") 311a of the stepped portion 311. The external terminals 312a are electrically connected to the electrode terminal pads 312b via via holes or interlayer connection (both not illustrated) and electrically connected to the circuit board 21 via the via holes, the interlayer connection, or a metal wire (all not illustrated). A central portion of the bottom portion of the base 31 is recessed downward in a rectangular shape and constitutes the recess portion 313. The seal ring 314 melts when the base 31 is sealed by the cover 32, thereby welding the base 31 and the cover 32. The seal ring 314 is made of metal such as Kovar (KOV), for example. The seal ring 314 is bonded to an end surface of the opening portion 31a of the base 31 with silver solder, for example.

The cover 32 air-tightly seals the opening portion 31a on a top portion of the base 31. The cover 32 has a rectangular plate shape and is made of metal such as Kovar (KOV), for example. The cover 32 is welded by the seal ring 314 to the end surface of the opening portion 31a of the base 31 under a vacuum atmosphere. As a result, the space inside the housing 30 (the resonator accommodating space 31c) is maintained in the vacuum atmosphere.

In this way, the opening portion 31a of the base 31 is sealed by the cover 32, and thus the housing 30 (the base 31, the cover 32) defines the resonator accommodating space 31c in which the crystal resonator 10 and the circuit unit 20 are accommodated inside the housing 30. That is, in the resonator accommodating space 31c, a space in which the crystal resonator 10 is accommodated (a space above the recess portion 313) functions as a resonator accommodating portion in the present invention. Furthermore, in the resonator accommodating space 31c, a space in which the circuit unit 20 is accommodated (a space inside the recess portion 313) functions as a circuit accommodating portion in the present invention. That is, the resonator accommodating space 31c functions as the resonator accommodating portion in the present invention and also functions as the circuit accommodating portion in the present invention. A lower surface 32b of the cover 32 faces the resonator accommodating space 31c and is directed to the crystal resonator 10. The upper surface 32a of the cover 32 is an example of a front surface in the present invention, and the lower surface 32b of the cover 32 is an example of a back surface in the present invention. The vertical direction is an example of the front-back direction of the cover 32 in the present invention.

In the space inside the housing 30 (the resonator accommodating space 31c), the space in which the circuit unit 20 is accommodated (the space inside the recess portion 313) also functions as the circuit accommodating space in the present invention. That is, the resonator accommodating space 31c includes the circuit accommodating space. That is, the housing 30 defines the circuit accommodating space in which the circuit unit 20 is accommodated.

The conductive adhesive 40 electrically connects each of a pair of connection electrodes 12a and 13a of the crystal resonator 10 to the electrode terminal pads 312b of the base 31. As a result, the crystal resonator 10 is mechanically fixed to the inside of the housing 30. That is, the crystal resonator 10 is mounted on the mounting surface 311a (the electrode terminal pads 312b) of the stepped portion 311 with the conductive adhesive 40 in a state substantially parallel to the cover 32. As a result, the crystal resonator 10 and the cover 32 face each other.

The temperature regulator 50 regulates the temperature of the crystal resonator 10 to the predetermined temperature (the peak temperature $T_0$) by repeating heating and cooling to the crystal resonator 10. The temperature regulator 50 has a rectangular plate shape. The temperature regulator 50 is a known peltier element having a structure in which a plurality of p-type and n-type semiconductors connected in series via metal, for example, are sandwiched between two insulating plates. A lower surface 50b of the temperature regulator 50 is bonded to the upper surface 32a of the cover 32 with an adhesive, for example. That is, the lower surface 50b of the temperature regulator 50 is attached to the upper surface 32a of the cover 32 in a state where the lower surface 50b abuts on the upper surface 32a. That is, the temperature regulator 50 is disposed on an outer side of the housing 30. The current to the temperature regulator 50 is supplied via an electric wire (not illustrated) provided in the temperature regulator 50 and interlayer connection (not illustrated) of the base 31, for example. The lower surface 50b is an example of another surface of the temperature regulator in the present invention.

The heat conducting plate 60 functions as a heat absorbing plate and a heat dissipating plate for the temperature regulator 50. That is, for example, when the temperature regulator 50 cools the crystal resonator 10, the heat conducting plate 60 functions as the heat dissipating plate that dissipates heat, which is radiated as heat energy from the crystal resonator 10, to the outside of the present oscillator 1 as waste heat from the temperature regulator 50. In contrast, for example, when the temperature regulator 50 heats the crystal resonator 10, the heat conducting plate 60 functions as the heat absorbing plate that absorbs heat from the external environmental space (e.g., in the atmosphere) to compensate for the heat radiated from the temperature regulator 50 (the cover 32). The heat conducting plate 60 has a rectangular plate shape and is made of metal with high thermal conductivity such as aluminum, for example. A lower surface 60b of the heat conducting plate 60 is bonded to the upper surface 50a of the temperature regulator 50 with an adhesive, for example. That is, the lower surface 60b of the heat conducting plate 60 is attached to the upper surface 50a of the temperature regulator 50 in a state where the lower surface 60b abuts on the upper surface 50a. An upper surface 60a of the heat conducting plate 60 faces the external environmental space (the space outside the present oscillator 1). The upper surface 50a is an example of one surface of the temperature regulator in the present invention.

In the present oscillator 1 configured as described above, the heat from the temperature regulator 50 is radiated as heat energy (hereinafter simply referred to as "heat energy") via an electromagnetic wave to a space inside the housing 30 via the cover 32. That is, the heat from the temperature regulator 50 is conducted into the cover 32 and radiated as the heat energy from the lower surface 32b of the cover 32 to the space inside the housing 30 (the space between the cover 32 and the crystal resonator 10: the resonator accommodating space 31c). As a result, the heat from the temperature regulator 50 is transferred as the heat energy to the crystal resonator 10. In contrast, the heat from the crystal resonator 10 is radiated as heat energy from the crystal resonator 10 to the resonator accommodating space 31c. The heat radiated to the resonator accommodating space 31c is absorbed by the cover 32, conducted into the cover 32, and radiated from the heat conducting plate 60 to the external environmental space via the temperature regulator 50. Accordingly, when the heat energy from the temperature regulator 50 is larger than the heat energy from the crystal resonator 10, the cover 32 functions as the heat dissipating plate for the temperature regulator 50 and the heat conducting plate 60 functions as the heat absorbing plate for the temperature regulator 50, thereby heating the crystal resonator 10. In contrast, when the heat energy from the temperature regulator 50 is smaller than the heat energy from the crystal resonator 10, the cover 32 functions as the heat absorbing plate for the temperature regulator 50 and the heat conducting plate 60 functions as the heat dissipating plate for the temperature regulator 50, thereby cooling the crystal resonator 10. In this way, the cover 32 and the heat conducting plate 60 function as the heat absorbing plate and the heat dissipating plate for the temperature regulator 50. As a result, the cover 32, the temperature regulator 50, and the heat conducting plate 60 function as a temperature regulating unit that controls the temperature of the crystal resonator 10. In this case, since a distance between the cover 32 and the crystal resonator 10 is as short as several tens to 100 µm, the heat energy is easily transferred to each of the crystal resonator 10 and the cover 32.

In the present oscillator 1, the temperature regulator 50 is a peltier element capable of heating and cooling the crystal resonator 10. Thus, the present oscillator 1 is able to forcibly lower the temperature of the crystal resonator 10 in a short time compared with the conventional OCXO that uses a heater to perform temperature control (cooling is performed by natural heat dissipation). That is, the present oscillator 1 is able to achieve fine temperature control (accurate temperature control) by finely controlling the rise and fall of the temperature. As a result, a controlled temperature range in the present oscillator 1 is controlled within a very narrow range of about ±1° C.

In the present oscillator 1, the peak temperature $T_0$ of the crystal resonator 10 is approximately 42° C. Accordingly, the controlled temperature of the present oscillator 1 is set near the peak temperature $T_0$ (e.g., at the peak temperature or within a range of the peak temperature ±5° C.). That is, the controlled temperature range of the present oscillator 1 is in a temperature range close to the substantially normal temperature. As a result, the heat energy required for the temperature control is smaller, and power consumption required for the temperature control of the present oscillator 1 can be significantly reduced compared with power consumption in the conventional OCXO in which the temperature control is performed at a higher temperature (70° C. to 80° C.) by using a heater.

Figure 7:
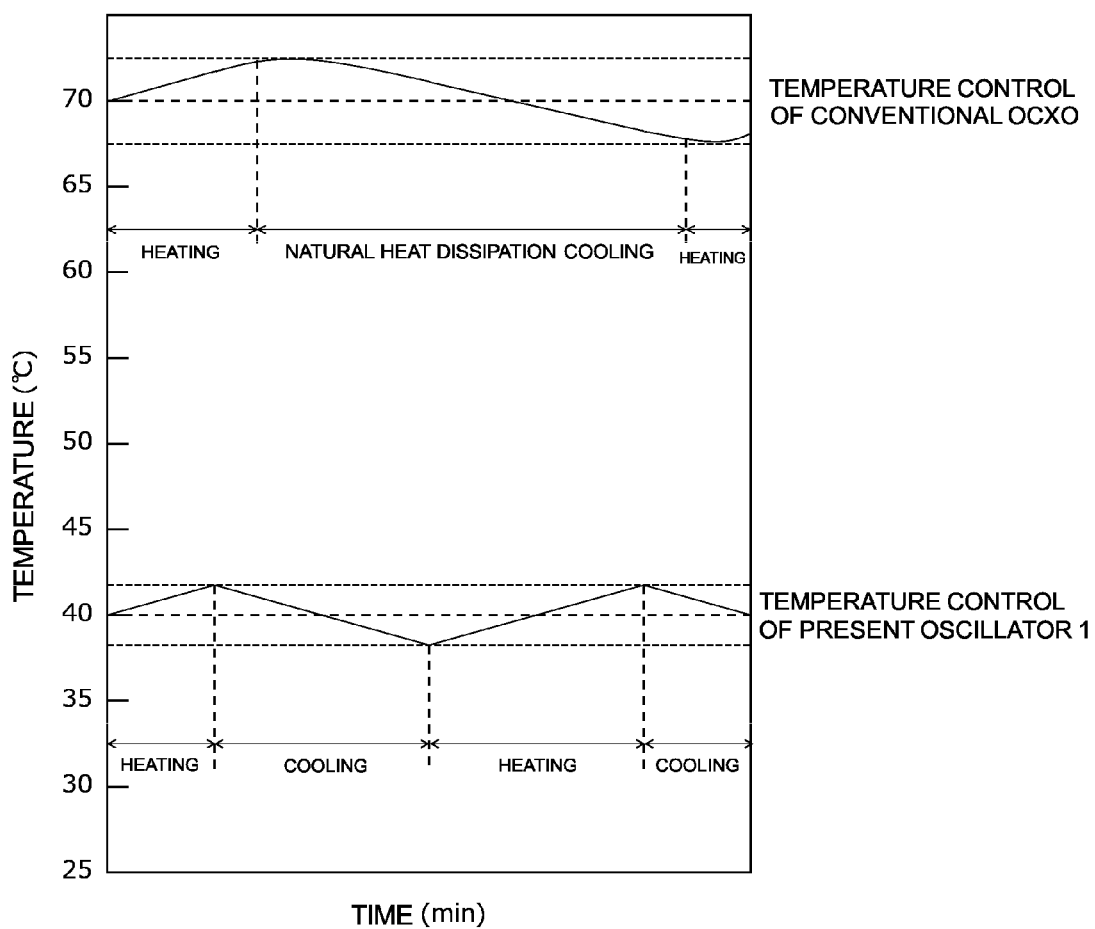
FIG. 7 is a schematic diagram illustrating a controlled temperature range of the thermostatic type crystal oscillator in FIG. 1 and a controlled temperature range of a conventional OCXO.
Figure 7:
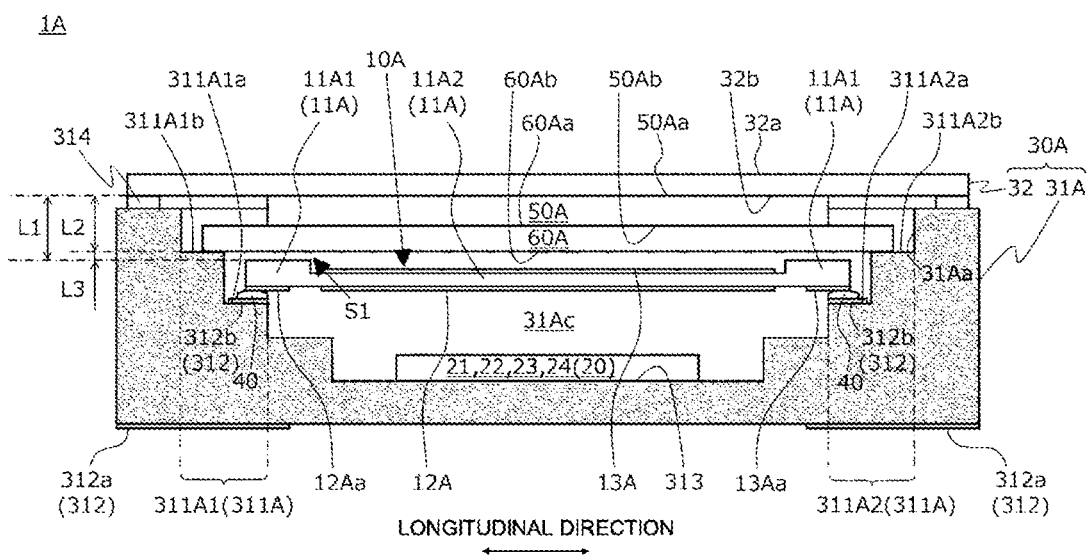

FIG. 7 is a schematic diagram illustrating the controlled temperature range of the present oscillator 1 and the controlled temperature range of the conventional OCXO.

As illustrated in FIG. 7, in the temperature control of the conventional OCXO, the rise and fall of the temperature is controlled by heating and natural heat dissipation cooling. Thus, in particular, the temperature control of the conventional OCXO requires time for the temperature to fall. In contrast, the temperature control of the present oscillator 1 enables heating and cooling forcibly, thereby shortening the time required for the rise and fall of the temperature. The controlled temperature range of the present oscillator 1 is narrower than that of the conventional OCXO.

Referring back to FIG. 1 and FIG. 2, in the configuration of the present oscillator 1, the housing 30 accommodating the crystal resonator 10 and the circuit unit 20 also functions as the thermostatic oven of the conventional OCXO when the space inside the housing 30 (the resonator accommodating space 31c) is filled with gas (e.g., nitrogen). As described above, in the present embodiment, the atmosphere of the resonator accommodating space 31c is the vacuum atmosphere. Thus, the resonator accommodating space 31c may function as a heat insulating layer, but does not function as the thermostatic oven (the tank that maintains the atmosphere inside the thermostatic oven at a constant temperature) of the conventional OCXO. That is, the present oscillator 1 does not have the thermostatic oven as is the case in the conventional OCXO. Thus, the external dimensions of the present oscillator 1 can be reduced compared with the external dimensions of the conventional OCXO where the crystal resonator is doubly accommodated by a housing and a housing for thermostatic oven. That is, for example, the present oscillator 1 is downsizable up to 2520 size (2.5 mm long, 2.0 mm wide) or 1612 size (1.6 mm long, 1.2 mm wide), which is similar to oscillators without the housing for thermostatic oven (e.g., temperature compensated crystal oscillator (TCXO) or simple packaged crystal oscillator (SPXO)).

As described above, the controlled temperature range of the present oscillator 1 is in the temperature range close to the substantially normal temperature and the heat from the cover 32 is easily transferred to the crystal resonator 10. As a result, in the present oscillator 1, a period from powering on to reaching a stable operation (an operation stabilization time) can be shortened to a few minutes.

Conclusion (1)

According to the embodiment described above, the present oscillator 1 includes the crystal resonator 10 having the IT cut crystal blank 11, the vibration control circuit 22 that controls the vibration frequency of the crystal resonator 10, the temperature regulator 50 that regulates the temperature of the crystal resonator 10 within the set temperature range (e.g., near the peak temperature $T_0$) by heating or cooling the crystal resonator 10, the heat conducting plate 60 that functions as the heat absorbing plate and the heat dissipating plate for the temperature regulator 50, the temperature control circuit 24 that controls the temperature of the temperature regulator 50, and the housing 30 that accommodates the crystal resonator 10. According to this configuration, the present oscillator 1 is able to lower the temperature of the crystal resonator 10 in a short time and achieve fine temperature control compared with the conventional OCXO that uses a heater to perform temperature control. As a result, the controlled temperature range in the present oscillator 1 is controlled within a very narrow range of about ±1° C. Further, cooling efficiency of the temperature regulator 50 that is the peltier element is improved. Furthermore, the housing 30 defines, inside the housing 30, the resonator accommodating space 31c in which the crystal resonator 10 is accommodated. According to this configuration, the crystal resonator 10 is not accommodated indirectly in the housing for thermostatic oven as is the case in the conventional OCXO having the thermostatic oven, but is directly accommodated in the housing 30 only. That is, the external dimensions of the present oscillator 1 can be reduced compared with the external dimensions of the conventional OCXO in which the crystal resonator is doubly accommodated by the housing and the housing for thermostatic oven.

In the present oscillator 1, heating and cooling of the crystal resonator 10 can be performed. Thus, the controlled temperature of the present oscillator 1 can be set to a lower temperature compared with the conventional OCXO in which the temperature in the thermostatic oven is controlled at a higher temperature near an upper limit temperature (approximately 85° C.) in an operation temperature range. As a result, the operation stabilization time of the present oscillator 1 can be significantly shortened compared with the conventional OCXO. Further, power consumption used in the temperature control can be significantly reduced compared with the conventional OCXO.

According to the embodiment described above, the lower surface 50b of the temperature regulator 50 is attached to the upper surface 32a of the cover 32. The upper surface 50a of the temperature regulator 50 is attached to the lower surface 60b of the heat conducting plate 60. That is, the temperature regulator 50 is disposed on the outer side of the housing 30. According to this configuration, the external dimensions of the housing 30 can be reduced compared with the conventional OCXO in which a heater is accommodated in the housing that constitutes the thermostatic oven. As a result, when the resonator accommodating space 31c is filled with gas (e.g., nitrogen), the volume of the space (the resonator accommodating space 31c) of which temperature is controlled by the temperature regulator 50 is greatly reduced, and followability and efficiency of the temperature control are improved.

According to the embodiment described above, the lower surface 50b of the temperature regulator 50 is attached to the upper surface 32a of the cover 32 in a state where the lower surface 50b abuts on the upper surface 32a. The upper surface 50a of the temperature regulator 50 is attached to the heat conducting plate 60. According to this configuration, the heat from the temperature regulator 50 (the crystal resonator 10) can be transferred as heat energy to the crystal resonator 10 (the temperature regulator 50) via the cover 32. That is, the cover 32 functions as the heat absorbing plate and the heat dissipating plate for the temperature regulator 50. Accordingly, in the present oscillator 1, the heat conducting plate 60 is attached only to the upper surface 50a of the temperature regulator 50. As a result, the height (the thickness) of the present oscillator 1 is smaller than a case where the heat conducting plate is attached on both sides of the temperature regulator.

According to the embodiment described above, the atmosphere of the space inside the housing 30 (i.e., the resonator accommodating space 31c) is the vacuum atmosphere. According to this configuration, the resonator accommodating space 31c functions as a heat insulating layer. The transfer of the heat between the crystal resonator 10 and the temperature regulator 50 is dominated by the radiation of heat energy via electromagnetic waves. As a result, changes in the ambient temperature (the environmental temperature) are less likely to be transmitted to the crystal resonator 10, and the efficiency of the temperature control by the temperature regulator 50 is improved.

According to the embodiment described above, the temperature regulator 50 is the peltier element. The peltier element is a simple-structured thermoelectric device, and, in recent years, the peltier element has been reduced in thickness and size. Thus, the present oscillator 1 is downsizable even when the temperature regulator 50 is disposed outside the housing 30.

According to the embodiment described above, the temperature of the crystal resonator 10 is regulated to the predetermined temperature (approximately 42° C.) being the peak temperature $T_0$. That is, the controlled temperature of the present oscillator 1 is in the temperature range close to the substantially normal temperature. As a result, the heat energy required for the temperature control is smaller and power consumption required for the temperature control of the present oscillator 1 can be significantly reduced compared with power consumption in the conventional OCXO in which the temperature control is performed at a higher temperature (70° C. to 80° C.) by using a heater. Furthermore, in the present oscillator 1, the period from powering on to reaching the stable operation (the operation stabilization time) can be shortened to a few minutes. Further, aging degradation of the circuits 22 to 24 included in the circuit unit 20 is also inhibited.

According to the embodiment described above, the temperature control circuit 24 controls the current through the temperature regulator 50, based on the B-mode signal. As described above, in the frequency temperature characteristic of the B mode, the frequency varies linearly with respect to the temperature change. According to this configuration, the present oscillator 1 can detect the temperature of the crystal resonator 10 with high accuracy without using an approximate expression based on a cubic curve, for example, and can control the temperature of the temperature regulator 50 depending on the temperature of the crystal resonator 10. Since the temperature of the crystal resonator 10 is directly detected based on the B-mode signal, the present oscillator 1 does not require a temperature sensor for detecting the temperature inside the thermostatic oven as is the case in the conventional OCXO. As a result, the present oscillator 1 is downsizable.

The temperature regulator in the present invention may be disposed inside the housing. That is, for example, the temperature regulator in the present invention may abut on the lower surface of the cover and may be attached to the lower surface. In this configuration, the cover performs the same function as the heat conducting plate in the present embodiment. Details of this configuration will be described later.

The temperature regulator in the present invention may be abut on the crystal blank in the present invention. That is, for example, the crystal blank in the present invention may be formed into an inverted mesa structure, and the temperature regulator may abut on an outer edge portion of the crystal blank. Details of this configuration will be described later.

The heat conducting plate in the present invention may abut on the crystal blank in the present invention. That is, the temperature regulating unit in the present invention may abut on the crystal blank in the present invention. Details of this configuration will be described later.

Thermostatic Type Crystal Oscillator (2)

Next, another embodiment of the present oscillator (hereinafter referred to as "second embodiment") will be described with a focus on differences from the embodiment described above (hereinafter referred to as "first embodiment"). In the present oscillator according to the second embodiment, the arrangement of the temperature regulator and the heat conducting plate differs from that of the present oscillator in the first embodiment. In the following description, elements in common with the first embodiment and elements that differ only in position (arrangement and orientation) from the first embodiment are indicated with the same reference signs, and part or all of description thereof will be omitted.

FIG. 8 is a schematic cross-sectional view of the present oscillator illustrating the another embodiment (the second embodiment) of the present oscillator.

FIG. 9 is a functional block diagram of the present oscillator.

A present oscillator 1A is an SMD-type thermostatic type crystal oscillator (present OCXO) that generates a signal of a predetermined oscillation frequency. The present oscillator 1A includes a crystal resonator 10A, the circuit unit 20, a housing 30A, the conductive adhesive 40, a temperature regulator 50A, and a heat conducting plate 60A.

The crystal resonator 10A generates the signal of the predetermined oscillation frequency. The crystal resonator 10A is accommodated in a resonator accommodating space (a cavity) 31Ac described later. The crystal resonator 10A includes a crystal blank 11A, a first main surface electrode 12A, and a second main surface electrode 13A.

The crystal blank 11A is an IT-cut (a double rotation cut) crystal blank. That is, the crystal resonator 10A is an IT-cut crystal resonator. The crystal blank 11A has a rectangular plate shape, for example. The crystal blank 11A includes a thick portion 11A1 and a thin portion 11A2. In an upper surface of the crystal blank 11A, a central area (a main vibration area) excluding an outer edge portion is recessed downward in a rectangular plate shape and constitutes the thin portion 11A2. In contrast, the outer edge portion constitutes the thick portion 11A1. That is, the thin portion 11A2 is thinner than the thick portion 11A1. That is, the crystal blank 11A is a crystal blank having a so-called inverted mesa structure on the upper surface. The first main surface electrode 12A is disposed on the thin portion 11A2 of a lower surface of the crystal blank 11A. The second main surface electrode 13A is disposed on the thin portion 11A2 of the upper surface of the crystal blank 11A.

The housing 30A accommodates the crystal resonator 10A and the circuit unit 20. The housing 30A includes a base 31A and the cover 32. The housing 30A is a known housing for the crystal oscillator having external dimensions with a length of 2.5 mm, a width of 2.0 mm, and a height of 0.9 mm, for example.

The base 31A is a sintered body in which a plurality of ceramic layers such as alumina, for example, is laminated. The base 31A has a rectangular shape in a plan view (viewed from the top) and has a box shape with an opening portion 31Aa opening upward. That is, the space (the resonator accommodating space 31Ac) in which the crystal resonator 10A and the circuit unit 20 are accommodated is defined in the base 31A. The base 31A includes a stepped portion 311A, the electrode terminal 312, the recess portion 313, and the seal ring 314. In the present embodiment, the base 31A has external dimensions with a length of 2.5 mm and a width of 2.0 mm, for example.

The stepped portion 311A includes a first stepped portion 311A1 and a second stepped portion 311A2. The first stepped portion 311A1 is disposed on one side (on the left side in FIG. 8) of a bottom portion of the base 31A in the longitudinal direction. The second stepped portion 311A2 is disposed on another side (on the right side in FIG. 8) in the longitudinal direction. In the vertical direction, an upper surface of the stepped portion 311A is disposed above an upper surface of a bottom portion of the base 31A. That is, the stepped portion 311A is higher than the bottom portion.

In an upper surface of the first stepped portion 311A1, an upper surface (hereinafter referred to as "mounting surface")

311A1*a* of an inner half portion (a half portion on the right side in FIG. 8) is a surface on which the crystal resonator 10A is mounted. An upper surface (hereinafter referred to as "abutting surface") 311A1*b* of an outer half portion (a half portion on the left side in FIG. 8) is a surface on which the heat conducting plate 60A abuts. In the vertical direction, the abutting surface 311A1*b* is disposed above the mounting surface 311A1*a* (i.e., on the cover 32 side) and on the outer side of the mounting surface 311A1*a* (on the left side in FIG. 8). That is, in the first stepped portion 311A1, the abutting surface 311A1*b* is higher than the mounting surface 311A1*a*.

In an upper surface of the second stepped portion 311A2, an upper surface (hereinafter referred to as "mounting surface") 311A2*a* of an inner half portion (a half portion on the left side in FIG. 8) is a surface on which the crystal resonator 10A is mounted. An upper surface (hereinafter referred to as "abutting surface") 311A2*b* of an outer half portion (a half portion on the right side in FIG. 8) is a surface on which the heat conducting plate 60A abuts. In the vertical direction, the abutting surface 311A2*b* is disposed above the mounting surface 311A2*a* (i.e., on the cover 32 side) and on the outer side of the mounting surface 311A2*a* (on the right side in FIG. 8). That is, in the second stepped portion 311A2, the abutting surface 311A2*b* is higher than the mounting surface 311A2*a*.

The electrode terminal 312 includes the external terminals 312*a* disposed on the lower surface of the bottom portion of the base 31A, and the pair of electrode terminal pads 312*b* disposed on the upper surface (the mounting surfaces 311A1*a*, 311A2*a*) of the stepped portion 311A. The external terminals 312*a* are electrically connected to the electrode terminal pads 312*b* via via holes or interlayer connection (both not illustrated) and electrically connected to the circuit board 21 via the via holes, the interlayer connection, or a metal wire (all not illustrated). A central portion of the bottom portion of the base 31A is recessed downward in a rectangular shape and constitutes the recess portion 313.

The cover 32 air-tightly seals the opening portion 31Aa of the base 31A. As a result, the housing 30A (the base 31A, the cover 32) defines the resonator accommodating space 31Ac in which the crystal resonator 10A and the circuit unit 20 are accommodated inside the housing 30A. The atmosphere in the resonator accommodating space 31Ac is the vacuum atmosphere. That is, the resonator accommodating space 31Ac functions as the resonator accommodating portion in the present invention and also functions as the circuit accommodating portion in the present invention. The upper surface (the front surface) 32*a* of the cover 32 faces the external environmental space. Apart of the lower surface (the back surface) 32*b* of the cover 32 faces the resonator accommodating space 31Ac. The upper surface 32*a* is an example of the front surface of the cover in the present invention, and the lower surface 32*b* is an example of the back surface of the cover in the present invention.

In the following description, in the space inside the housing 30A (the resonator accommodating space 31Ac), the space in which the circuit unit 20 is accommodated (the space inside the recess portion 313) also functions as the circuit accommodating space in the present invention. That is, the resonator accommodating space 31Ac includes the circuit accommodating space.

The conductive adhesive 40 electrically connects each of a pair of connecting electrodes 12Aa and 13Aa of the crystal resonator 10A to the electrode terminal pads 312*b* of the base 31A. That is, the crystal resonator 10A is mounted on the mounting surfaces 311A1*a*, 311A2*a* (the electrode terminal pads 312*b*) of the stepped portion 311A with the conductive adhesive 40 in a state substantially parallel to the cover 32. That is, in the longitudinal direction, both end portions of the crystal resonator 10A are supported by the mounting surfaces 311A1*a*, 311A2*a*.

The configuration of the temperature regulator 50A is common to the configuration of the temperature regulator 50 in the first embodiment except for the difference in size. In the longitudinal direction, the length of the temperature regulator 50A is shorter than the length of the opening portion 31Aa of the base 31A and is longer than the length of the thin portion 11A2 of the crystal blank 11A. An upper surface 50Aa of the temperature regulator 50A is bonded to the lower surface 32*b* of the cover 32 with an adhesive, for example. That is, the upper surface 50Aa of the temperature regulator 50A is attached to the lower surface 32*b* of the cover 32 in a state where the upper surface 50Aa abuts on the lower surface 32*b*. That is, the temperature regulator 50A is disposed in the space inside the housing 30A (the resonator accommodating space 31Ac). The current to the temperature regulator 50A is supplied via an electric wire (not illustrated) provided in the temperature regulator 50A and interlayer connection (not illustrated) of the base 31A, for example. The upper surface 50Aa is an example of one surface of the temperature regulator in the present invention, and a lower surface 50Ab is an example of another surface of the temperature regulator in the present invention.

The configuration of the heat conducting plate 60A is common to the configuration of the heat conducting plate 60 in the first embodiment except for the difference in size. In the longitudinal direction, the length of the heat conducting plate 60A is shorter than the length of the opening portion 31Aa of the base 31A and is longer than the length of the crystal resonator 10A. An upper surface 60Aa of the heat conducting plate 60A is bonded to the lower surface 50Ab of the temperature regulator 50A with an adhesive, for example. That is, the upper surface 60Aa of the heat conducting plate 60A is attached to the lower surface 50Ab of the temperature regulator 50A in a state where the upper surface 60Aa abuts on the lower surface 50Ab. An outer edge portion of a lower surface 60Ab of the heat conducting plate 60A abuts on the abutting surfaces 311A1*b*, 311A2*b* of the base 31A. That is, the heat conducting plate 60A is disposed in the space inside the housing 30A (the resonator accommodating space 31Ac). The lower surface 60Ab of the heat conducting plate 60A faces the resonator accommodating space 31Ac and is directed to the crystal resonator 10A. As a result, the entire upper surface of the crystal resonator 10A faces the lower surface 60Ab of the heat conducting plate 60A.

In the vertical direction, a distance "L1" between the cover 32 and the crystal resonator 10A is larger than a distance "L2" between the cover 32 and each of the abutting surfaces 311A1*b* and 311A2*b*. As described above, the heat conducting plate 60A abuts on the abutting surfaces 311A1*b*, 311A2*b*, and thus a gap Si exists between the heat conducting plate 60A and the crystal resonator 10A with a distance "L3" equivalent to the difference "L1-L2" between the distance "L2" and the distance "L1". That is, the heat conducting plate 60A faces the crystal resonator 10A so as to cover the crystal resonator 10A with the gap Si interposed therebetween. In other words, the heat conducting plate 60A is in close proximity to the crystal resonator 10A at the distance of "L3". In this way, the heat conducting plate 60A abuts on the abutting surfaces 311A1*b*, 311A2*b*, and thus the heat conducting plate 60A does not contact the crystal resonator 10A, and the gap Si with the distance of "L3" surely exists between the crystal resonator 10A and the heat conducting plate 60A.

In the present oscillator 1A configured in this way, the heat from the temperature regulator 50A is radiated as heat energy to the space inside the housing 30A via the heat conducting plate 60A. That is, the heat from the temperature regulator 50A is conducted into the heat conducting plate 60A, radiated as heat energy from the lower surface 60Ab of the heat conducting plate 60A to the space inside the housing 30A (the space between the heat conducting plate 60A and the crystal resonator 10A: the resonator accommodating space 31Ac), and absorbed by the crystal resonator 10A. As a result, the heat from the temperature regulator 50A is transferred as the heat energy to the crystal resonator 10A. In contrast, the heat from the crystal resonator 10A is radiated as heat energy from the crystal resonator 10A to the resonator accommodating space 31Ac. The heat radiated to the resonator accommodating space 31Ac is absorbed by the heat conducting plate 60A and radiated from the cover 32 to the external environmental space via the temperature regulator 50A. Accordingly, when the heat energy from the temperature regulator 50A is larger than the heat energy from the crystal resonator 10A, the cover 32 functions as the heat absorbing plate for the temperature regulator 50A and the heat conducting plate 60A functions as the heat dissipating plate for the temperature regulator 50A, and thus the crystal resonator 10A is heated. In contrast, when the heat energy from the temperature regulator 50A is smaller than the heat energy from the crystal resonator 10A, the cover 32 functions as the heat dissipating plate for the temperature regulator 50A and the heat conducting plate 60A functions as the heat absorbing plate for the temperature regulator 50A, and thus the crystal resonator 10A is cooled. In this way, the cover 32 and the heat conducting plate 60A function as the heat absorbing plate and the heat dissipating plate for the temperature regulator 50A. In this case, since the distance "L3" between the cover 32 and the crystal resonator 10A is as short as several 10 μm, the heat energy is easily transferred to the crystal resonator 10A and the cover 32.

As described above, in the present embodiment, the atmosphere of the space inside the housing 30A (the resonator accommodating space 31Ac) is the vacuum atmosphere. Thus, the resonator accommodating space 31Ac may function as a heat insulating layer, but does not function as the thermostatic oven (the tank that maintains the atmosphere inside the thermostatic oven at a constant temperature) of the conventional OCXO. That is, the present oscillator 1A does not have the thermostatic oven as is the case in the conventional OCXO. Thus, the external dimensions of the present oscillator 1A can be reduced compared with the external dimensions of the conventional OCXO in which the crystal resonator is doubly accommodated by the housing and the housing for thermostatic oven.

As described above, in the present oscillator 1A, the temperature regulator 50A and the heat conducting plate 60A are disposed inside the housing 30A. Thus, in the vertical direction, the length (the height) of the housing 30A of the present oscillator 1A may be longer than the length of the housing 30 in the first embodiment. However, as described above, the heat conducting plate 60 abuts on the abutting surfaces 311A1b, 311A2b, and thus, while the abutting between the crystal resonator 10A and the heat conducting plate 60A is avoided, the distance "L3" between the crystal resonator 10A and the heat conducting plate 60A can be shorter than the distance between the crystal resonator 10 and the cover 32 in the first embodiment. In the present oscillator 1A, the temperature regulator 50A and the heat conducting plate 60A are not disposed outside the housing 30A. Thus, in the vertical direction, the external dimensions of the present oscillator 1A can be reduced to be equivalent to or smaller than the external dimensions of the present oscillator 1 in the first embodiment.

Conclusion (2)

According to the embodiment described above, the present oscillator 1A includes the crystal resonator 10A having the IT cut crystal blank 11A, the vibration control circuit 22 that controls the vibration frequency of the crystal resonator 10A, the temperature regulator 50A that regulates the temperature of the crystal resonator 10A within the set temperature range (e.g., near the peak temperature $T_O$) by heating or cooling the crystal resonator 10A, the heat conducting plate 60A that functions as the heat absorbing plate and the heat dissipating plate for the temperature regulator 50A, the temperature control circuit 24 that controls the temperature of the temperature regulator 50A, and the housing 30A that accommodates the crystal resonator 10A. According to this configuration, similarly to the first embodiment, the present oscillator 1A is able to lower the temperature of the crystal resonator 10A in a short time and achieve fine temperature control compared with the conventional OCXO. As a result, the controlled temperature range in the present oscillator 1A is controlled within a very narrow range of about $\pm 1°$ C. Further, cooling efficiency of the temperature regulator 50A that is the peltier element is improved. Further, the housing 30A defines, inside the housing 30A, the resonator accommodating space 31Ac in which the crystal resonator 10A is accommodated. According to this configuration, similarly to the first embodiment, the crystal resonator 10A is directly accommodated in the housing 30A only. That is, the external dimensions of the present oscillator 1A can be reduced to substantially the same external dimensions as the TCXO or the SPXO, which does not include a housing for thermostatic oven.

In the present oscillator 1A, heating and cooling of the crystal resonator 10A can be performed. Thus, similarly to the first embodiment, the controlled temperature of the present oscillator 1A can be set to a lower temperature compared with the conventional OCXO. As a result, compared with the conventional OCXO, the operation stabilization time of the present oscillator 1A can be significantly reduced, and power consumption used for the temperature control can be significantly reduced.

According to the embodiment described above, the temperature regulator 50A and the heat conducting plate 60A are disposed in the resonator accommodating space 31Ac. According to this configuration, the temperature regulator 50A and the heat conducting plate 60A are not visually recognized from outside of the present oscillator 1A, and the appearance of the present oscillator 1A is improved more than the appearance of the present oscillator 1 in the first embodiment. The temperature regulator 50A and the heat conducting plate 60A are protected by the housing 30A. Furthermore, the distance between the crystal resonator 10A and the temperature regulator 50A can be shorter than that of the first embodiment.

According to the embodiment described above, the housing 30A includes the base 31A having the opening portion 31Aa and on which the crystal resonator 10A is mounted, and the cover 32 that seals the opening portion 31Aa. The cover 32 includes the upper surface 32a facing the external environmental space of the housing 30A and the lower surface 32b facing the resonator accommodating space 31Ac. According to this configuration, the present oscillator 1A does not have the thermostatic oven as is the case in the conventional OCXO. Thus, the external dimensions of the present oscillator 1A can be reduced up to substantially the same external dimensions as the TCXO or the SPXO, compared with the external dimensions of the conventional OCXO in which the crystal resonator is doubly accommodated by the housing and the housing for thermostatic oven.

According to the embodiment described above, the upper surface 50Aa of the temperature regulator 50A is attached to the lower surface 32b of the cover 32. The lower surface 50Ab of the temperature regulator 50A is attached to the upper surface 60Aa of the heat conducting plate 60A. In the heat conducting plate 60A, the surface (the lower surface 60Ab) on the opposite side to the surface (the upper surface 60Aa) abutting on the temperature regulator 50A is directed to the crystal resonator 10A. According to this configuration, the heat conducting plate 60A faces the crystal resonator 10A, and only the space (the resonator accommodating space 31Ac) is disposed therebetween. Thus, heat transfer between the heat conducting plate 60A and the crystal resonator 10A is performed via only the radiation of heat energy to the resonator accommodating space 31Ac. The radiated heat energy is transferred to both the heat conducting plate 60A and the crystal resonator 10A in the resonator accommodating space 31Ac without being obstructed by other objects. As a result, the heat is efficiently transferred between the heat conducting plate 60A and the crystal resonator 10A.

According to the embodiment described above, the base 31A includes the mounting surfaces 311A1a and 311A2a on which the crystal resonator 10A is mounted, and the abutting surfaces 311A1b and 311A2b on which the heat conducting plate 60A abuts. According to this configuration, the heat conducting plate 60A abuts on the abutting surfaces 311A1b and 311A2b, and thus a position of the heat conducting plate 60A within the housing 30A (the resonator accommodating space 31Ac) is fixed to some extent.

According to the embodiment described above, when viewed from the front-back direction (when viewed from the vertical direction) of the cover 32, the abutting surfaces 311A1b and 311A2b are disposed on the outer side of the mounting surfaces 311A1a and 311A2a. According to this configuration, the heat conducting plate 60A is positioned by abutting on the abutting surfaces 311A1b and 311A2b and disposed in the resonator accommodating space 31Ac so as to cover the crystal resonator 10A.

According to the embodiment described above, in the front-back direction (the vertical direction) of the cover 32, the abutting surfaces 311A1b and 311A2b are disposed closer to the cover 32 than the mounting surfaces 311A1a and 311A2a. According to this configuration, in the resonator accommodating space 31Ac, approach of the heat conducting plate 60A to the crystal resonator 10A can be regulated and controlled by the abutting surfaces 311A1b and 311A2b. That is, the distance "L3" between the crystal resonator 10A and the heat conducting plate 60A can be adjusted.

According to the embodiment described above, in the front-back direction (the vertical direction) of the cover 32, the distance "L1" between the cover 32 and the crystal blank 11A is longer than the distance "L2" between the cover 32 and each of the abutting surfaces 311A1b and 311A2b. According to this configuration, the heat conducting plate 60A does not contact the crystal resonator 10A and the gap Si with the distance of "L3" surely exists between the crystal resonator 10A and the heat conducting plate 60A. Thus, the crystal resonator 10A vibrates without being affected by the heat conducting plate 60A.

According to the embodiment described above, the heat conducting plate 60A faces the crystal resonator 10A with the gap Si interposed therebetween. According to this configuration, the heat conducting plate 60A is in close proximity to the crystal resonator 10A without contact, and the crystal resonator 10A vibrates without being affected by the heat conducting plate 60A. As a result, the crystal resonator 10A and the heat conducting plate 60A can transfer the heat in close proximity without affecting the vibration of the crystal resonator 10A.

MODIFICATION EXAMPLE

Next, modification examples of the second embodiment will be described with a focus on differences from the second embodiment described above.

Modification Example (1)

First, a first modification example of the present oscillator in the second embodiment (hereinafter referred to as "first modification example") will be described. The present oscillator in the first modification example differs from the present oscillator in the second embodiment in that the heat conducting plate (the temperature regulating unit) abuts on the crystal resonator (the crystal blank).

FIG. 10 is a schematic cross-sectional view of the present oscillator illustrating the first modification example of the present oscillator in the second embodiment.

A present oscillator 1B includes the crystal resonator 10A, the circuit unit 20, the housing 30A, the conductive adhesive 40, the temperature regulator 50A, and the heat conducting plate 60A.

In the vertical direction, the distance "L1" between the cover 32 and the crystal resonator 10A is the same as the distance "L2" between the cover 32 and each of the abutting surfaces 311A1b and 311A2b. That is, the outer edge portion of the lower surface 60Ab of the heat conducting plate 60A abuts on the abutting surfaces 311A1b and 311A2b of the base 31A. The portion inside the outer edge portion abuts on the upper surface of the thick portion 11A1 of the crystal resonator 10A. That is, the lower surface 60Ab of the heat conducting plate 60A abuts on the crystal blank 11A. In other words, the temperature regulating unit abuts on the crystal blank 11A. As a result, a gap SB1 depending on a thickness difference between the thick portion 11A1 and the thin portion 11A2 exists between the thin portion 11A2 of the crystal resonator 10A and the heat conducting plate 60A. Accordingly, the heat conducting plate 60A faces the thin portion 11A2 with the gap SB1 interposed therebetween. As a result, the heat conducting plate 60A does not abut on the thin portion 11A2 that is a main vibration area, and the influence on the main vibration of the crystal blank 11A by abutting is small. In this way, the configuration in which the heat conducting plate 60A abuts on the crystal resonator 10A is achieved by adjusting the amount (the height) of the conductive adhesive 40, the height of the abutting surfaces 311A1b and 311A2b, and the thickness of the crystal blank 11A, for example.

In the present oscillator 1B configured in this way, the heat from the temperature regulator 50A is conducted to the heat conducting plate 60A and the thick portion 11A1 of the crystal resonator 10A and is also transferred to the thin portion 11A2 as heat energy radiated to the gap SB1. In contrast, the heat from the crystal resonator 10A is conducted from the thick portion 11A1 to the heat conducting plate 60A and is also transferred to the heat conducting plate 60A as heat energy radiated from the thin portion 11A2 to the gap SB1. That is, in the present oscillator 1B, the heat between the crystal resonator 10A and the temperature regulator 50A is transferred by the conduction between solids and the radiation to the gap SB1. According to this configuration, the heat between the crystal resonator 10A and the temperature regulator 50A can be transferred faster and more efficiently than the second embodiment.

Modification Example (2)

Next, a second modification example of the present oscillator in the second embodiment (hereinafter referred to as "second modification example") will be described. The present oscillator in the second modification example differs from the present oscillator in the second embodiment in the shape of the crystal resonator and in the area where the crystal resonator and the heat conducting plate face each other.

Figure 11:
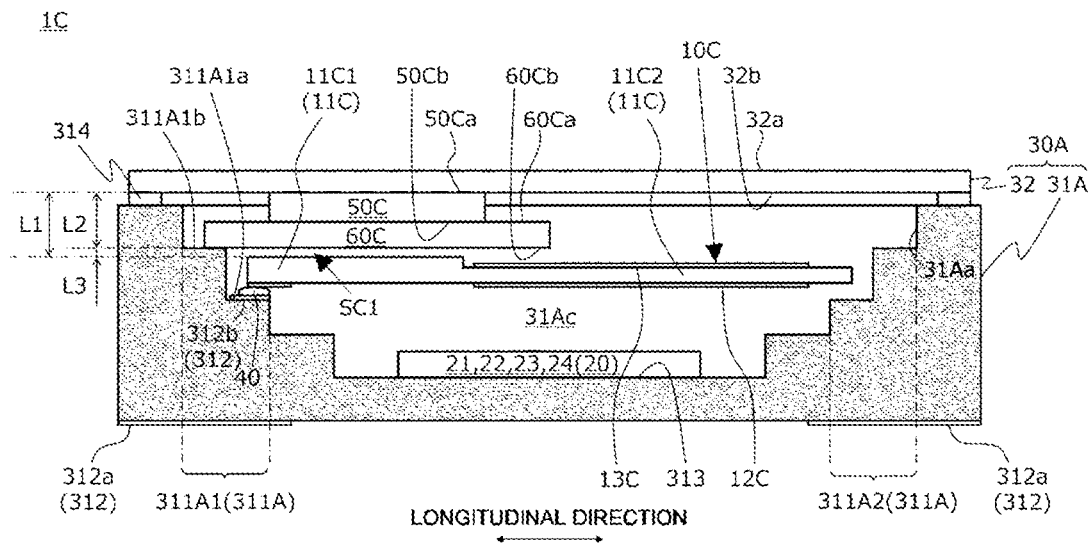
FIG. 11 is a schematic cross-sectional view of the thermostatic type crystal oscillator illustrating a second modification example of the thermostatic type crystal oscillator in FIG. 8.

FIG. 11 is a schematic cross-sectional view of the present oscillator illustrating the second modification example of the present oscillator in the second embodiment.

A present oscillator 1C includes a crystal resonator 10C, the circuit unit 20, the housing 30A, the conductive adhesive 40, a temperature regulator 50C, and a heat conducting plate 60C.

The crystal resonator 10C includes a crystal blank 11C, a first main surface electrode 12C, and a second main surface electrode 13C. The crystal blank 11C includes a thick portion 11C1 and a thin portion 11C2. In the longitudinal direction, approximately ⅔ of the area of an upper surface of the crystal blank 11C from an end portion on one side (on the right side in FIG. 11) is recessed downward in a rectangular plate shape and constitutes the thin portion 11C2. The remaining approximately ⅓ of the area constitutes the thick portion 11C1. The first main surface electrode 12C is disposed on the thin portion 11C2 of a lower surface of the crystal blank 11C. The second main surface electrode 13C is disposed on the thin portion 11C2 of the upper surface of the crystal blank 11C.

In the second modification example, the crystal resonator 10C is not mounted on the second stepped portion 311A2, and the heat conducting plate 60C does not abut on the second stepped portion 311A2. The electrode terminal pads 312b are disposed only on the mounting surface 311A1a of the first stepped portion 311A1. That is, the crystal resonator 10C is mounted on the mounting surface 311A1a of the first stepped portion 311A1 with the conductive adhesive 40 in a state substantially parallel to the cover 32. The heat conducting plate 60C abuts on the abutting surface 311A1b of the first stepped portion 311A1.

The configuration of the temperature regulator 50C is common to the configuration of the temperature regulator 50A in the second embodiment except for the difference in size. In the longitudinal direction, the length of the temperature regulator 50C is substantially the same as the length of the thick portion 11C1 of the crystal blank 11C. That is, in the longitudinal direction, the length of the temperature regulator 50C is shorter than the length of the temperature regulator 50A in the second embodiment. The temperature regulator 50C is disposed above the thick portion 11C1 of the crystal blank 11C in the resonator accommodating space 31Ac. An upper surface 50Ca of the temperature regulator 50C is attached to the lower surface 32b of the cover 32 in a state where the upper surface 50Ca abuts on the lower surface 32b. The upper surface 50Ca is an example of one surface of the temperature regulator in the present invention.

The configuration of the heat conducting plate 60C is common to the configuration of the heat conducting plate 60A in the second embodiment except for the difference in size. In the longitudinal direction, the length of the heat conducting plate 60C is long enough to cover the thick portion 11C1 of the crystal blank 11C. That is, in the longitudinal direction, the length of the heat conducting plate 60C is shorter than the length of the heat conducting plate 60A in the second embodiment. In the resonator accommodating space 31Ac, the heat conducting plate 60C is disposed above the thick portion 11C1 of the crystal blank 11C so as to cover the thick portion 11C1. An upper surface 60Ca of the heat conducting plate 60C is attached to a lower surface 50Cb of the temperature regulator 50C in a state where the upper surface 60Ca abuts on the lower surface 50Cb. A lower surface 60Cb of the heat conducting plate 60C faces the thick portion 11C1 with a gap SC1 interposed therebetween. In other words, the heat conducting plate 60C is in close proximity to the crystal resonator 10C at the distance of "L3". In this way, the heat conducting plate 60C abuts on the abutting surface 311A1b, and thus the heat conducting plate 60C does not contact the crystal resonator 10C, and the gap SC1 with the distance of "L3" surely exists between the crystal resonator 10C and the heat conducting plate 60C. The lower surface 50Cb is an example of another surface of the temperature regulator in the present invention.

In the present oscillator 1C configured in this way, the heat from the temperature regulator 50C is radiated as heat energy from the heat conducting plate 60C to the gap SC1 (the resonator accommodating space 31Ac), absorbed mainly by the thick portion 11C1 of the crystal resonator 10C, and transferred from the thick portion 11C1 to the thin portion 11C2. In contrast, the heat from the crystal resonator 10C is radiated as heat energy from the entire surface of the crystal resonator 10C, but mainly the heat energy radiated from the thick portion 11C1 is absorbed by the heat conducting plate 60C.

Modification Example (3)

Next, a third modification example of the present oscillator in the second embodiment (hereinafter referred to as "third modification example") will be described. The present oscillator in the third modification example differs from the present oscillator in the second modification example in that the heat conducting plate (the temperature regulating unit) abuts on the crystal resonator (the crystal blank).

Figure 12:
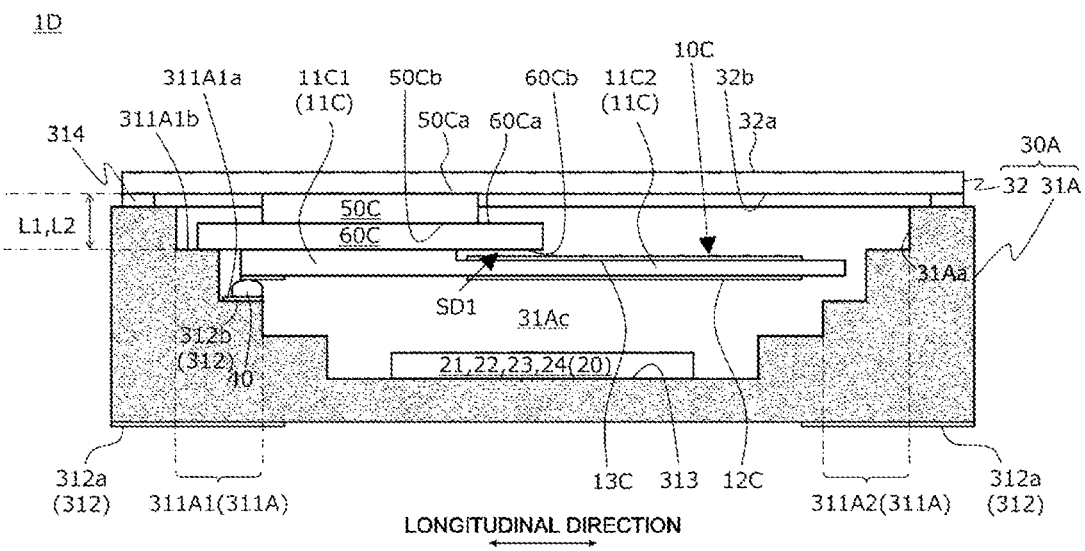
FIG. 12 is a schematic cross-sectional view of the thermostatic type crystal oscillator illustrating a third modification example of the thermostatic type crystal oscillator in FIG. 8.

FIG. 12 is a schematic cross-sectional view of the present oscillator illustrating the third modification example of the present oscillator in the second embodiment.

A present oscillator 1D includes the crystal resonator 10C, the circuit unit 20, the housing 30A, the conductive adhesive 40, the temperature regulator 50C, and the heat conducting plate 60C.

In the vertical direction, the distance "L1" between the cover 32 and the crystal blank 11C is the same as the distance "L2" between the cover 32 and the abutting surface 311A1b. That is, an outer edge portion of the lower surface 60Cb of the heat conducting plate 60C abuts on the abutting surface 311A1b of the base 31A. The portion inside the outer edge portion abuts on the upper surface of the thick portion 11C1 of the crystal resonator 10C. That is, the lower surface 60Cb of the heat conducting plate 60C abuts on the crystal blank 11C. In other words, the temperature regulating unit abuts on the crystal blank 11C. That is, a gap SD1 depending on a thickness difference between the thick portion 11C1 and the thin portion 11C2 exists between the thin portion 11C2 of the crystal resonator 10C and a part of the heat conducting plate 60C.

In the present oscillator 1D configured in this way, the heat from the temperature regulator 50C is conducted to the heat conducting plate 60C and the thick portion 11C1 of the crystal resonator 10C. In contrast, the heat from the crystal resonator 10C is conducted from the thick portion 11C1 to the heat conducting plate 60C. That is, in the present oscillator 1D, most of the heat between the crystal resonator 10C and the temperature regulator 50C is transferred by the conduction between solids. According to this configuration, the heat between the crystal resonator 10C and the temperature regulator 50C can be transferred faster than the second modification example.

Modification Example (4)

Next, a fourth modification example of the present oscillator in the second embodiment (hereinafter referred to as "fourth modification example") will be described. The present oscillator in the fourth modification example differs from the present oscillator in the second embodiment in the shape of the stepped portion and in the shape of the heat conducting plate.

Figure 13:
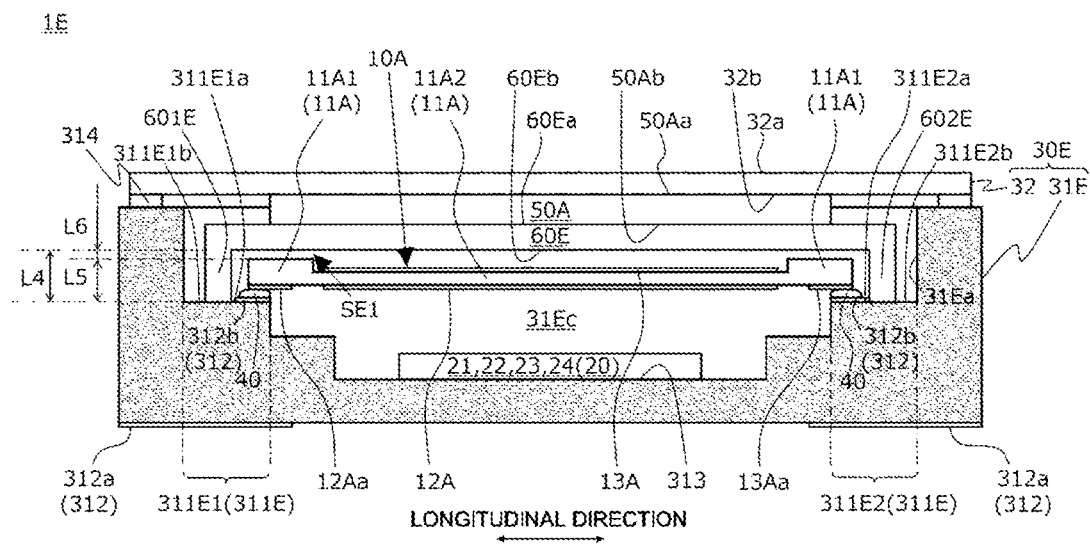
FIG. 13 is a schematic cross-sectional view of the thermostatic type crystal oscillator illustrating a fourth modification example of the thermostatic type crystal oscillator in FIG. 8.

FIG. 13 is a schematic cross-sectional view of the present oscillator illustrating the fourth modification example of the present oscillator in the second embodiment.

A present oscillator 1E includes the crystal resonator 10A, the circuit unit 20, a housing 30E, the conductive adhesive 40, the temperature regulator 50A, and a heat conducting plate 60E.

The housing 30E accommodates the crystal resonator 10A and the circuit unit 20. The housing 30E includes a base 31E and the cover 32.

The base 31E is a sintered body in which a plurality of ceramic layers such as alumina, for example, is laminated. The base 31E has a rectangular shape in a plan view (viewed from the top) and has a box shape with an opening portion 31Ea opening upward. That is, a space in which the crystal resonator 10A and the circuit unit 20 are accommodated (a resonator accommodating space (a cavity) 31Ec) is defined in the base 31E. The base 31E includes a stepped portion 311E, the electrode terminal 312, the recess portion 313, and the seal ring 314.

The stepped portion 311E includes a first stepped portion 311E1 and a second stepped portion 311E2. The first stepped portion 311E1 is disposed on one side (on the left side in FIG. 13) of a bottom portion of the base 31E in the longitudinal direction. The second stepped portion 311E2 is disposed on another side (on the right side in FIG. 13) in the longitudinal direction. In the vertical direction, an upper surface of the stepped portion 311E is disposed above an upper surface of the bottom portion of the base 31E. That is, the stepped portion 311E is higher than the bottom portion.

In an upper surface of the first stepped portion 311E1, an upper surface (hereinafter referred to as "mounting surface") 311E1a of an inner half portion (a half portion on the right side in FIG. 13) is a surface on which the crystal resonator 10A is mounted. An upper surface (hereinafter referred to as "abutting surface") 311E1b of an outer half portion (a half portion on the left side in FIG. 13) is a surface on which the heat conducting plate 60E abuts. In the vertical direction, the abutting surface 311E1b and the mounting surface 311E1a are positioned at the same height from the lower surface.

In an upper surface of the second stepped portion 311E2, an upper surface (hereinafter referred to as "mounting surface") 311E2a of an inner half portion (a half portion on the left side in FIG. 13) is a surface on which the crystal resonator 10A is mounted. An upper surface (hereinafter referred to as "abutting surface") 311E2b of an outer half portion (a half portion on the right side in FIG. 13) is a surface on which the heat conducting plate 60E abuts. In the vertical direction, the abutting surface 311E2b and the mounting surface 311E2a are positioned at the same height from the lower surface.

The electrode terminal pads 312b are disposed on the mounting surfaces 311E1a and 311E2a.

The heat conducting plate 60E includes two convex portions 601E and 602E. In the longitudinal direction, both end portions of the heat conducting plate 60E are bent downward at right angles and constitute the convex portions 601E and 602E.

An upper surface 60Ea of the heat conducting plate 60E is attached to the lower surface 50Ab of the temperature regulator 50A in a state where the upper surface 60Ea abuts on the lower surface 50Ab. The lower ends of the convex portions 601E and 602E of the heat conducting plate 60E abut on the abutting surfaces 311E1b and 311E2b, respectively. As a result, the heat conducting plate 60E is disposed in the resonator accommodating space 31Ec so as to surround above the crystal resonator 10A and the both sides of the crystal resonator 10A in the longitudinal direction.

In the vertical direction, the length of each of the convex portions 601E and 602E "L4" is longer than a distance "L5" between each of the mounting surfaces 311E1a and 311E2a and the upper surface of the crystal resonator 10A. As described above, the convex portions 601E and 602E of the heat conducting plate 60E abut on the abutting surfaces 311E1b and 311E2b, respectively, and thus a gap SE1 exists between the heat conducting plate 60E and the crystal resonator 10A with a distance "L6" equivalent to the difference ("L4−L5") between the length "L4" of each of the convex portions 601E and 602E and the distance "L5". That is, a lower surface 60Eb of the heat conducting plate 60E faces the crystal resonator 10A. That is, the heat conducting plate 60E faces the crystal blank 11A with the gap SE1 interposed between the heat conducting plate 60E and the crystal resonator 10A. In other words, the heat conducting plate 60E is in close proximity to the crystal blank 11A at the distance of "L6". In this way, the heat conducting plate 60E abuts on the abutting surfaces 311E1b and 311E2b, and thus the heat conducting plate 60E does not contact the crystal resonator 10A, and the gap SE1 with the distance of "L6" surely exists between the crystal resonator 10A and the heat conducting plate 60E.

In the present oscillator 1E configured in this way, the heat from the temperature regulator 50A is radiated as heat energy from three directions to the gap SE1 (the resonator accommodating space 31Ec) and absorbed by the crystal resonator 10A. In contrast, the heat from the crystal resonator 10A is radiated as heat energy to the gap SE1 (the resonator accommodating space 31Ec) and absorbed by the heat conducting plate 60E from three directions.

Modification Example (5)

Next, a fifth modification example of the present oscillator in the second embodiment (hereinafter referred to as "fifth modification example") will be described. The present oscillator in the fifth modification example differs from the present oscillator in the second embodiment in the shape of the stepped portion and in that the heat conducting plate does not abut on the housing, and is common to the present oscillator in the first embodiment with respect to the configuration of the crystal resonator.

Figure 14:
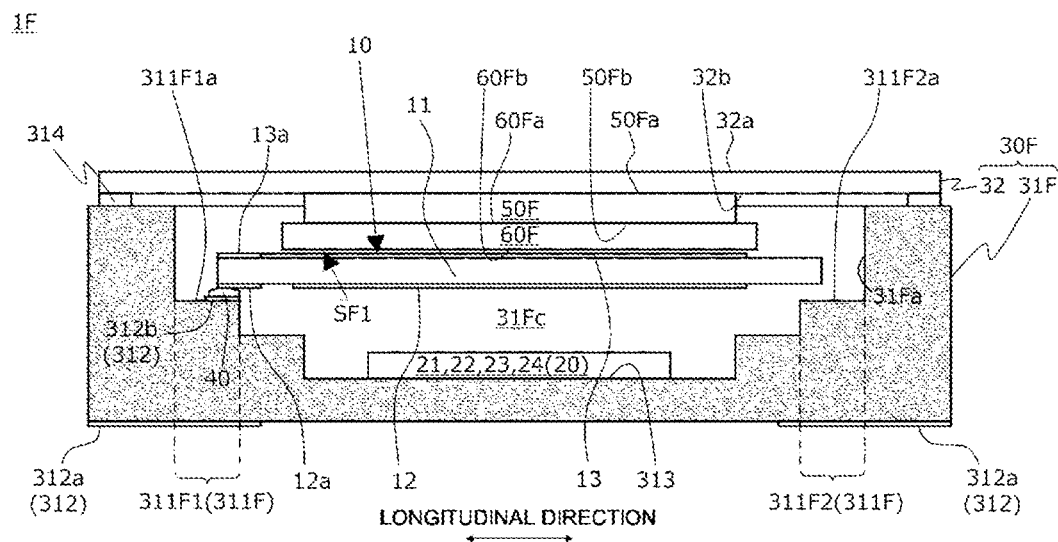
FIG. 14 is a schematic cross-sectional view of the thermostatic type crystal oscillator illustrating a fifth modification example of the thermostatic type crystal oscillator in FIG. 8.

FIG. 14 is a schematic cross-sectional view of the present oscillator illustrating the fifth modification example of the present oscillator in the second embodiment.

A present oscillator 1F includes the crystal resonator 10, the circuit unit 20, a housing 30F, the conductive adhesive 40, the temperature regulator 50F, and a heat conducting plate 60F.

The housing 30F accommodates the crystal resonator 10 and the circuit unit 20. The housing 30F includes a base 31F and the cover 32.

The base 31F is a sintered body in which a plurality of ceramic layers such as alumina, for example, is laminated. The base 31F has a rectangular shape in a plan view (viewed from the top) and has a box shape with an opening portion 31Fa opening upward. That is, a space in which the crystal resonator 10 and the circuit unit 20 are accommodated (a resonator accommodating space (a cavity) 31Fc) is defined in the base 31F. The base 31F includes a stepped portion 311F, the electrode terminal 312, the recess portion 313, and the seal ring 314.

The stepped portion 311F includes a first stepped portion 311F1 and a second stepped portion 311F2. The first stepped portion 311F1 is disposed on one side (on the left side in FIG. 14) of a bottom portion of the base 31F in the longitudinal direction. The second stepped portion 311F2 is disposed on another side (on the right side in FIG. 14) in the longitudinal direction. In the vertical direction, an upper surface of the stepped portion 311F is disposed above an upper surface of the bottom portion of the base 31F. That is, the stepped portion 311F is higher than the bottom portion.

An upper surface (hereinafter referred to as "mounting surface") 311F1a of the first stepped portion 311F1 is a surface on which the crystal resonator 10 is mounted. In the fifth modification example, the heat conducting plate 60F does not abut on the first stepped portion 311F1 and the second stepped portion 311F2. The crystal resonator 10 is not mounted on the second stepped portion 311F2. The electrode terminal pads 312b are disposed only on the mounting surface 311F1a of the first stepped portion 311F1. That is, the crystal resonator 10 is mounted on the mounting surface 311F1a of the first stepped portion 311F1 with the conductive adhesive 40 in a state substantially parallel to the cover 32.

The configuration of the temperature regulator 50F is common to the configuration of the temperature regulator 50 in the second embodiment except for the difference in size. In the longitudinal direction, the length of the temperature regulator 50F is shorter than the length of the crystal blank 11. The temperature regulator 50F is disposed above the main vibration area of the crystal resonator 10 in the resonator accommodating space 31Fc. An upper surface 50Fa of the temperature regulator 50F is attached to the lower surface 32b of the cover 32 in a state where the upper surface 50Fa abuts on the lower surface 32b.

The configuration of the heat conducting plate 60F is common to the configuration of the heat conducting plate 60A in the second embodiment except for the difference in size. In the longitudinal direction, the length of the heat conducting plate 60F is shorter than the length of the crystal blank 11. The heat conducting plate 60F is disposed above the main vibration area (area where the second main surface electrode 13 is disposed) of the crystal resonator 10 in the resonator accommodating space 31Fc. An upper surface 60Fa of the heat conducting plate 60F is attached to a lower surface 50Fb of the temperature regulator 50F in a state where the upper surface 60Fa abuts on the lower surface 50Fb. A lower surface 60Fb of the heat conducting plate 60F faces the resonator accommodating space 31Fc and is directed to the main vibration area of the crystal resonator 10. As a result, the lower surface 60Fb of the heat conducting plate 60F faces the main vibration area of the crystal resonator 10 with a gap SF1 interposed between the heat conducting plate 60F and the crystal resonator 10.

In the present oscillator 1F configured in this way, the heat from the temperature regulator 50F is radiated as heat energy from the heat conducting plate 60F to the gap SF1 (the resonator accommodating space 31Fc) and absorbed by the crystal resonator 10. In contrast, the heat from the crystal resonator 10 is radiated as heat energy from the entire surface of the crystal resonator 10 to the gap SF1 (the resonator accommodating space 31Fc) and absorbed by the heat conducting plate 60F.

Modification Example (6)

Next, a sixth modification example of the present oscillator in the second embodiment (hereinafter referred to as "sixth modification example") will be described. The present oscillator in the sixth modification example differs from the present oscillator in the second embodiment in that the temperature regulator (the temperature regulating unit) is mounted on the crystal resonator (the crystal blank).

Figure 15:
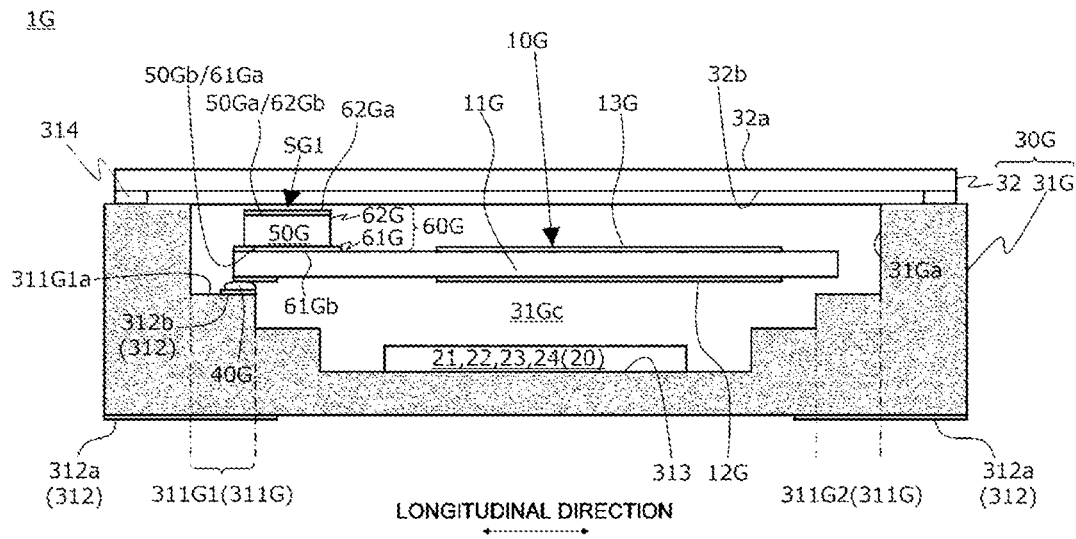
FIG. 15 is a schematic cross-sectional view of the thermostatic type crystal oscillator illustrating a sixth modification example of the thermostatic type crystal oscillator in FIG. 8.

FIG. 15 is a schematic cross-sectional view of the present oscillator illustrating the sixth modification example of the present oscillator in the second embodiment.

A present oscillator 1G includes a crystal resonator 10G, the circuit unit 20, a housing 30G, a conductive adhesive 40G, a temperature regulator 50G, and a heat conducting plate 60G.

The crystal resonator 10G includes a crystal blank 11G, a first main surface electrode 12G, a second main surface electrode 13G, and an electrode for temperature regulator (not illustrated, the same applies below). The crystal resonator 10G is disposed in a resonator accommodating space 31Gc.

The configuration of the crystal blank 11G is common to the configuration of the crystal blank 11 in the first embodiment.

The configurations of the first main surface electrode 12G and the second main surface electrode 13G are common to the configurations of the first main surface electrode 12 and the second main surface electrode 13 in the first embodiment, respectively. The first main surface electrode 12G is disposed on a lower surface of the crystal blank 11G of which area is approximately ⅔ of the lower surface near one end in the longitudinal direction. When viewed from the vertical direction, the second main surface electrode 13G is disposed on an upper surface of the crystal blank 11G at a position overlapping with the first main surface electrode 12G.

The electrode for temperature regulator supplies the temperature regulator 50G with a current required to operate the temperature regulator 50G. The electrode for temperature regulator is disposed on the upper surface of the crystal blank 11G of which area is approximately ⅓ of the upper surface near another end in the longitudinal direction, which is an area where the second main surface electrode 13G is not disposed, i.e., an area other than the main vibration area.

The ⅓ area is a mounting area where the temperature regulator 50G and the heat conducting plate 60G are mounted.

The housing 30G includes a base 31G and the cover 32.

The configuration of the base 31G is common to the configuration of the base 31F in the fifth modification example. That is, the base 31G includes a stepped portion 311G (a first stepped portion 311G1, a second stepped portion 311G2), the electrode terminal 312, and the recess portion 313. In the base 31G, an electrode (not illustrated, the same applies below) electrically connected to the electrode for temperature regulator of the crystal resonator 10G is also disposed on an upper surface (hereinafter referred to as "mounting surface") 311G1a of the first stepped portion 311G1.

The configuration of the conductive adhesive 40G is common to the configuration of the conductive adhesive 40 in the second embodiment. The conductive adhesive 40G also electrically connects between the electrode for temperature regulator of the crystal resonator 10G and the electrode disposed on the mounting surface 311G1a.

The configuration of the temperature regulator 50G is common to the configuration of the temperature regulator 50A in the second embodiment except for the difference in size. When viewed from the vertical direction, the size of the temperature regulator 50G is the size that can be mounted on the mounting area of the crystal resonator 10G. That is, for example, in the longitudinal direction, the length of the temperature regulator 50G is shorter than ⅓ of the length of the crystal blank 11G. A lower surface 50Gb of the temperature regulator 50G is attached to (mounted on) an upper surface 61Ga of a first heat conducting plate 61G described later in a state where the lower surface 50Gb abuts on the upper surface 61Ga.

The heat conducting plate 60G functions as the heat absorbing plate and the heat dissipating plate for the temperature regulator 50G. The heat conducting plate 60G includes the first heat conducting plate 61G and a second heat conducting plate 62G. Each of the first heat conducting plate 61G and the second heat conducting plate 62G has a rectangular film shape. When viewed from the vertical direction, the size of the heat conducting plate 60G is larger than or equal to the size of the temperature regulator 50G and is the size that can be mounted on the mounting area of the crystal resonator 10G. Specifically, the size of the second heat conducting plate 62G is smaller than the size of the first heat conducting plate 61G and is the same as the size of the temperature regulator 50G. The thickness of each of the first heat conducting plate 61G and the second heat conducting plate 62G is smaller than the thickness of the crystal blank 11G, for example. A lower surface 61Gb of the first heat conducting plate 61G is attached to the mounting area of the crystal blank 11G in a state where the lower surface 61Gb abuts on the mounting area. In other words, the temperature regulating unit abuts on the crystal blank 11G. A lower surface 62Gb of the second heat conducting plate 62G is attached to an upper surface 50Ga of the temperature regulator 50G in a state where the lower surface 62Gb abuts on the upper surface 50Ga. As a result, an upper surface 62Ga of the second heat conducting plate 62G faces the lower surface 32b of the cover 32 with a gap SG1 interposed therebetween. In other words, the second heat conducting plate 62G is in close proximity to the crystal blank 11G at the distance of the gap SG1.

In this way, each of the temperature regulator 50G and the heat conducting plate 60G is not mounted in the main vibration area (the portions where the first main surface electrode 12G and the second main surface electrode 13G are disposed) but in the mounting area of the crystal blank 11G. Thus, the housing 30F can be smaller than that of other modification examples. Further, each of the temperature regulator 50G and the heat conducting plate 60G can directly heat and cool the crystal blank 11G without significantly affecting the main vibration of the crystal blank 11G. The heat from the temperature regulator 50G is conducted to the crystal blank 11G (the crystal resonator 10G) via the first heat conducting plate 61G. In this case, the heat from the cover 32 is radiated to the resonator accommodating space 31Gc and absorbed by the second heat conducting plate 62G and the crystal resonator 10G. In contrast, the heat from the crystal resonator 10G is conducted to the temperature regulator 50G via the first heat conducting plate 61G, radiated as heat energy from the second heat conducting plate 62G to the gap SG1, and absorbed by the cover 32. The heat absorbed by the cover 32 is conducted into the cover 32 and transferred from the upper surface 32a of the cover 32 to the external environmental space.

Thermostatic Type Crystal Oscillator (3)

Next, still another embodiment of the present oscillator (hereinafter referred to as "third embodiment") will be described with a focus on differences from the first embodiment and the second embodiment described above. In the following description, elements in common with the first embodiment and the second embodiment, and elements that differ only in position (arrangement and orientation) from the first embodiment and the second embodiment are indicated with the same reference signs, and part or all of description thereof will be omitted.

Figure 16:
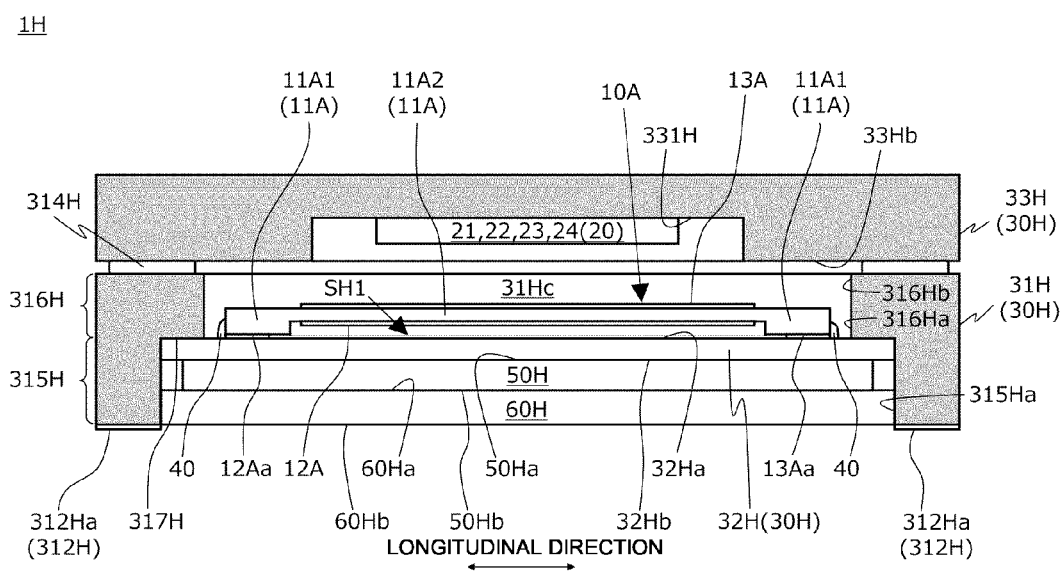
FIG. 16 is a schematic cross-sectional view of the thermostatic type crystal oscillator illustrating still another embodiment of the thermostatic type crystal oscillator according to the present invention.

FIG. 16 is a schematic cross-sectional view of the present oscillator illustrating still another embodiment (the third embodiment) of the present oscillator.

A present oscillator 1H is an SMD-type thermostatic type crystal oscillator (present OCXO) that generates a predetermined oscillation frequency. The present oscillator 1H includes the crystal resonator 10A, the circuit unit 20, a housing 30H, the conductive adhesive 40, a temperature regulator 50H, and a heat conducting plate 60H.

In the third embodiment, an orientation of the crystal resonator 10A is vertically reversed from that of the crystal resonator 10A in the second embodiment. That is, in the lower surface of the crystal blank 11A, the central area (the main vibration area) excluding the outer edge portion is recessed upward in a rectangular plate shape and constitutes the thin portion 11A2. In contrast, the outer edge portion constitutes the thick portion 11A1. That is, the crystal blank 11A is the crystal blank having a so-called inverted mesa structure on the lower surface.

The housing 30H accommodates the crystal resonator 10A and the circuit unit 20. The housing 30H includes a base 31H, a first cover 32H, and a second cover 33H.

The base 31H is a sintered body in which a plurality of ceramic layers such as alumina, for example, is laminated. The base 31H includes an electrode terminal 312H, a sealing material 314H, a lower half portion 315H, an upper half portion 316H, and a stepped portion 317H. The lower half portion 315H and the upper half portion 316H have a rectangular ring shape. An inner surface of the upper half portion 316H protrudes more inward than an inner surface of the lower half portion 315H. A lower surface of the protruding portion of the upper half portion 316H constitutes the stepped portion 317H. The upper half portion 316H has a first opening portion 316Ha opening downward (i.e., the lower half portion 315H) and a second opening portion 316Hb opening upward. The lower half portion 315H has a third opening portion 315Ha opening downward. The sealing material 314H melts when the second cover 33H seals the base 31H, and welds the base 31H and the second cover 33H. The sealing material 314H is made of low-melting-point metal, for example, and is bonded to an end surface of the second opening portion 316Hb.

The electrode terminal 312H includes external terminals 312Ha disposed on a lower surface of a bottom portion of the base 31H, and a pair of electrode terminal pads (not illustrated, the same applies below) disposed on an upper surface 32Ha of the first cover 32H. The external terminals 312Ha are electrically connected to the electrode terminal pads via via holes or interlayer connection (both not illustrated) and an electrode (not illustrated, the same applies below) disposed on the upper surface 32Ha of the first cover 32H, and the external terminals 312Ha are electrically connected to the circuit board 21 via the electrode or a metal wire (both not illustrated).

The first cover 32H air-tightly seals the first opening portion 316Ha of the base 31H. The first cover 32H has a rectangular plate shape and is made of non-conductive and highly thermally conductive ceramics such as aluminium nitride, for example. The first cover 32H is accommodated in the lower half portion 315H of the base 31H and welded to an end surface of the first opening portion 316Ha (i.e., the stepped portion 317H) under the vacuum atmosphere.

The second cover 33H air-tightly seals the second opening portion 316Hb of the base 31H. The second cover 33H has a rectangular plate shape having about half the thickness of the base 31H. The second cover 33H includes a recess portion 331H. A central portion of a lower surface 33Hb of the second base 33H is recessed upward in a rectangular shape and constitutes the recess portion 331H. The circuit unit 20 is accommodated in the recess portion 331H. The second cover 33H is welded to the end surface of the second opening portion 316Hb under the vacuum atmosphere.

In this way, the first cover 32H and the second cover 33H are welded to the base 31H under the vacuum atmosphere, and thus the housing 30H (the base 31H, the first cover 32H, the second cover 33H) defines a resonator accommodating space 31Hc in which the crystal resonator 10A and the circuit unit 20 are accommodated inside the housing 30H. That is, the resonator accommodating space 31Hc functions as the resonator accommodating portion in the present invention and also functions as the circuit accommodating portion in the present invention. The upper surface 32Ha of the first cover 32H faces the resonator accommodating space 31Hc and is directed to the crystal resonator 10A. The upper surface 32Ha of the first cover 32H is an example of the back surface of the first cover in the present invention, and a lower surface 32Hb of the cover 32H is an example of the front surface of the first cover in the present invention.

The conductive adhesive 40 electrically connects each of the pair of connecting electrodes 12Aa and 13Aa of the crystal resonator 10A to the electrode terminal pads disposed on the upper surface (the back surface) 32Ha of the first cover 32H. In other words, the crystal resonator 10A is mounted on the first cover 32H in substantially parallel to the first cover 32H. As a result, the thin portion 11A2 of the crystal resonator 10A and the first cover 32H face each other.

The configuration of the temperature regulator 50H is common to the configuration of the temperature regulator 50 in the first embodiment except for the difference in size. In the longitudinal direction, the length of the temperature regulator 50H is shorter than the length of lower half portion 315H of the base 31H. The temperature regulator 50H is disposed below the first cover 32H and accommodated in the lower half portion 315H of the base 31H. An upper surface 50Ha of the temperature regulator 50H is attached to the lower surface 32Hb of the first cover 32H in a state where the upper surface 50Ha abuts on the lower surface 32Hb. That is, the temperature regulator 50H is disposed on the outer side of the housing 30H and accommodated in the lower half portion 315H of the base 31H.

The configuration of the heat conducting plate 60H is common to the configuration of the heat conducting plate 60 in the first embodiment except for the difference in size. In the longitudinal direction, the length of the heat conducting plate 60H is substantially the same as the length of the lower half portion 315H of the base 31H. The heat conducting plate 60H is disposed below the temperature regulator 50H and accommodated in the lower half portion 315H of the base 31H. An upper surface 60Ha of the heat conducting plate 60H is attached to a lower surface 50Hb of the temperature regulator 50H in a state where the upper surface 60Ha abuts on the lower surface 50Hb. That is, the heat conducting plate 60H is disposed on the outer side of the housing 30H and accommodated in the lower half portion 315H of the base 31H.

In the present oscillator 1H configured in this way, the heat from the temperature regulator 50H is conducted to the crystal resonator 10A via the first cover 32H, the electrode terminal pads, and the conductive adhesive 40. The heat from the temperature regulator 50H is radiated as heat energy from the first cover 32H into a gap SH1 between the first cover 32H and the thin portion 11A2 of the crystal resonator 10A (a resonator accommodating space 31Hc). In contrast, the heat from the crystal resonator 10A is conducted to the first cover 32H via the conductive adhesive 40 and the electrode terminal pads. Further, the heat from the crystal resonator 10A is radiated as heat energy from the thin portion 11A2 to the gap SH1 and absorbed by the first cover 32H.

As described above, in the present embodiment, the atmosphere of the space inside the housing 30H (the resonator accommodating space 31Hc) is the vacuum atmosphere. Thus, the resonator accommodating space 31Hc may function as a heat insulating layer, but does not function as the thermostatic oven (the tank that maintains the atmosphere inside the thermostatic oven at a constant temperature) of the conventional OCXO. That is, the present oscillator 1H does not have the thermostatic oven as is the case in the conventional OCXO. Thus, the external dimensions of the present oscillator 1H can be reduced up to substantially the same external dimensions as the TCXO or the SPXO, compared with the external dimensions of the conventional OCXO where the crystal resonator is doubly accommodated by the housing and the housing for thermostatic oven.

As described above, in the present oscillator 1H, the first cover 32H, the temperature regulator 50H, and the heat conducting plate 60H are accommodated in the lower half portion 315H of the base 31H. Thus, in the vertical direction, the temperature regulator 50H and the heat conducting plate 60H do not protrude externally from the housing 30H, even when the temperature regulator 50H and the heat conducting plate 60H are disposed outside the housing 30H. Thus, the temperature regulator 50H and the heat conducting plate 60H are protected by the housing 30H.

Conclusion (3)

According to the embodiment described above, the present oscillator 1H includes the crystal resonator 10A having the IT cut crystal blank 11A, the vibration control circuit 22 that controls the vibration frequency of the crystal resonator 10A, the temperature regulator 50H that regulates the temperature of the crystal resonator 10A within the set temperature range (e.g., near the peak temperature $T_0$) by heating or cooling the crystal resonator 10A, the heat conducting plate 60H that functions as the heat absorbing plate and the heat dissipating plate for the temperature regulator 50H, the temperature control circuit 24 that controls the temperature of the temperature regulator 50H, and the housing 30H that accommodates the crystal resonator 10A. According to this configuration, the present oscillator 1H is able to reduce the temperature of the crystal resonator 10A in a short time and achieve fine temperature control compared with the conventional OCXO. As a result, the controlled temperature range in the present oscillator 1H is controlled within a very narrow range of about ±1° C. Further, cooling efficiency of the temperature regulator 50H that is the peltier element is improved. Further, the housing 30H defines, inside the housing 30H, the resonator accommodating space 31Hc in which the crystal resonator 10A is accommodated. According to this configuration, the crystal resonator 10A is not accommodated indirectly in the housing for thermostatic oven as is the case in the conventional OCXO having the thermostatic oven, but is directly accommodated in the housing 30H only. That is, the external dimensions of the present oscillator 1H can be reduced to substantially the same external dimensions as the TCXO or the SPXO, which does not include a housing for thermostatic oven.

According to the embodiment described above, the temperature regulator 50H is attached to the lower surface 32Hb of the first cover 32H. According to this configuration, the heat from the temperature regulator 50H is radiated as heat energy from the first cover 32H and can be transferred to the crystal resonator 10A, and the heat from the crystal resonator 10A is radiated as heat energy from the first cover 32H and can be transferred to the temperature regulator 50H. That is, the first cover 32H functions as the heat absorbing plate and the heat dissipating plate for the temperature regulator 50H. In this way, in the present oscillator 1H, the heat conducting plate 60H is mounted on only the lower surface 50Hb of the temperature regulator 50H. As a result, the height (the thickness) of the present oscillator 1H is smaller than the case where the heat conducting plate is attached on both sides of the temperature regulator.

According to the embodiment described above, the housing 30H includes the base 31H having the first opening portion 316Ha and the second opening portion 316Hb accommodating the crystal resonator 10A, the first cover 32H that seals the first opening portion 316Ha, and the second cover 33H that seals the second opening portion 316Hb. The temperature regulator 50H is attached to the lower surface 32Hb of the first cover 32H. The crystal resonator 10A is mounted on the upper surface 32Ha of the first cover 32H. In other words, the crystal resonator 10A and the temperature regulator 50H are attached to both surfaces (the upper surface 32Ha and the lower surface 32Hb) of one first cover 32H. According to this configuration, the heat from the temperature regulator 50H is conducted via the first cover 32H, and the heat from the crystal resonator 10A is conducted via the first cover 32H. Thus, the heat from the temperature regulator 50H can be transferred faster and efficiently to the crystal resonator 10A, and the heat from the crystal resonator 10A can be transferred faster and efficiently to the temperature regulator 50H.

According to the embodiment described above, the atmosphere of the space inside the housing 30H (i.e., the resonator accommodating space 31Hc) is the vacuum atmosphere. According to this configuration, the resonator accommodating space 31Hc functions as a heat insulating layer. As a result, changes in the ambient temperature (the environmental temperature) are less likely to be transmitted to the crystal resonator 10A, and the efficiency of the temperature control by the temperature regulator 50H is improved.

Others

Note that, in the embodiments described above, the space inside the housing in the present invention (the resonator accommodating space) may be an inert gas atmosphere such as nitrogen gas, for example.

In the first to second embodiments described above, the cover in the present invention may include an insulator such as glass or ceramics. In this configuration, the current to the temperature regulator may be supplied via via holes formed in the cover.

In the embodiments described above, the present oscillator need not include the heat conducting plate according to the purpose and/or environment of use of the present oscillator. That is, for example, when ambient temperature in which the present oscillator is used is within an allowable temperature range for cooling by the temperature regulator in the present invention (when the temperature difference between the ambient temperature and the controlled temperature is small), the present oscillator need not include the heat conducting plate. In this case, the external dimensions of the present oscillator are further reduced.

In the third embodiment described above, the first cover in the present invention may include a conductor such as metal. In this case, the upper surface of the first cover in the present invention is coated with an insulating material, for example.

In the embodiments described above, the peak temperature $T_0$ of the crystal resonator in the present invention may be set to a temperature range close to the room temperature and is not limited to approximately 42° C. That is, for example, the peak temperature of the crystal resonator may be set within a range of 30° C. to 50° C. or may be set within a range of 35° C. to 45° C. In this case, the predetermined temperature of the crystal resonator regulated by the temperature regulator is set within a range of 30° C. to 50° C. or within a range of 35° C. to 45° C. according to the peak temperature of the crystal resonator.

In the embodiments described above, the peak temperature $T_0$ of the crystal resonator in the present invention may be set to a lower temperature (e.g., within a range of 50° C. to 60° C.) than controlled temperature of the conventional OCXO, according to the purpose and/or environment of use of the present oscillator. Even in this configuration, the power consumption in the present oscillator is lowered, and the external dimensions of the present oscillator can be reduced, compared with the conventional OCXO.

In the embodiments described above, the housing in the present invention may be formed in an "H" shape in a cross-sectional view. That is, for example, the housing in the present invention may include a first recess portion that functions as the resonator accommodating portion in which the crystal resonator is accommodated and a second recess portion that functions as the circuit accommodating portion in which the circuit unit is accommodated in the lower half portion. In this case, for example, the first recess portion opens upward, and the second recess portion opens downward. Further, for example, the first recess portion may be sealed in the vacuum atmosphere or the inert gas atmosphere by the cover, and the second recess portion may be exposed to the outside without being sealed or may be sealed in the vacuum atmosphere or the inert gas atmosphere by another cover. As a result, the resonator accommodating space is isolated from the circuit accommodating space. Accordingly, the crystal resonator is isolated from the temperature control circuit and the vibration control circuit. In this configuration, since the circuit accommodating portion that accommodates the circuit unit, which is a factor in generating heat within the housing, and the resonator accommodating portion that accommodates the crystal resonator are isolated from each other, the operation stabilization time is shortened.

In the embodiments described above, the material of the base in the present invention is not limited to ceramics such as alumina. That is, for example, the base in the present invention may be made of glass. In this case, the base is manufactured using a photolithography process, for example, and thus the electrodes can be disposed accurately and intricately. In this case, for example, the cover may also be made of glass.

The shape of the crystal blank in the present invention is not limited to the shapes of the embodiments (the modification examples). That is, for example, when the crystal blank in the present invention does not abut on the temperature regulator, the shape of the crystal blank in the present invention may be any of the shapes of the crystal blank in the embodiments (the modification examples).

In the first, third, and sixth modification examples, the temperature regulator in the present invention may abut on the crystal blank. In this case, for example, the present oscillator does not include the heat conducting plate (the first heat conducting plate), and the cover may function as the heat conducting plate in the present invention.

The configuration (arrangement and the like) of the electrodes disposed in the crystal resonator or the housing in the present invention is not limited to the embodiments (the modification examples), as long as the vibration of the vibration element and the temperature regulator can be controlled.

In the embodiments described above, the connection between the crystal resonator and the electrode terminal pads is not limited to the connection with the conductive adhesive. That is, for example, the connection between the crystal resonator and the electrode terminal pads may be connection using a bump formed by plating or the like.

Aspects of the Present Invention

Next, aspects of the present invention conceived from the embodiments described above will be described below with reference to the terms and reference signs described in the embodiments.

A first aspect of the present invention is a thermostatic type crystal oscillator (e.g., the thermostatic type crystal oscillator 1, 1A, 1B, 1C, 1D, 1E, 1F, 1G, 1H) including a crystal resonator (e.g., the crystal resonator 10, 10A, 10C, 10G) that includes an IT-cut crystal blank (e.g., the crystal blank 11, 11A, 11C, 11G); a vibration control circuit (e.g., the vibration control circuit 22) configured to control a vibration frequency of the crystal resonator; a temperature regulator (e.g., the temperature regulator 50, 50A, 50C, 50G, 50H) configured to regulate a temperature of the crystal resonator within a set temperature range by repeating heating and cooling to the crystal resonator; a heat conducting plate (e.g., the heat conducting plate 60, 60A, 60C, 60E, 60G, 60H) configured to function as a heat absorbing plate and a heat dissipating plate for the temperature regulator; a temperature control circuit (e.g., the temperature control circuit 24) configured to control a temperature of the temperature regulator; and a housing (e.g., the housing 30, 30A, 30E, 30F, 30H) that accommodates the crystal resonator, in which the housing defines, inside the housing, a resonator accommodating space (the resonator accommodating space 31c, 31Ac, 31Ec, 31Fc, 31Gc, 31Hc) in which the crystal resonator is accommodated.

A second aspect of the present invention is the thermostatic type crystal oscillator (e.g., the thermostatic type crystal oscillator 1A, 1B, 1C, 1D, 1E, 1F, 1G) in which, in the first aspect, the temperature regulator (e.g., the temperature regulator 50A, 50C, 50F, 50G) and the heat conducting plate (e.g., the heat conducting plate 60A, 60C, 60E, 60F, 60G) are disposed in the resonator accommodating space (e.g., the resonator accommodating space 31Ac, 31Ec, 31Fc, 31Gc).

A third aspect of the present invention is the thermostatic type crystal oscillator in which, in the second aspect, the housing (e.g., the housing 30A, 30E, 30F) includes a base (e.g., the base 31A, 31E, 31F, 31G) having an opening portion (e.g., the opening portion 31Aa, 31Ea, 31Fa, 31Ga) and on which the crystal resonator (e.g., the crystal resonator 10, 10A, 10C, 10G) is mounted, and a cover (e.g., the cover 32) that seals the opening portion, in which the cover includes a front surface (e.g., the upper surface 32a) that faces external environmental space of the housing and a back surface (e.g., the lower surface 32b) that faces the resonator accommodating space.

A fourth aspect of the present invention is the thermostatic type crystal oscillator in which, in the third aspect, one surface (e.g., the upper surface 50Aa, 50Ca, 50Fa, 50Ga) of the temperature regulator is attached to the back surface of the cover, another surface (e.g., the lower surface 50Ab, 50Cb, 50Fb, 50Gb) of the temperature regulator is attached to the heat conducting plate, and an opposite side surface (e.g., the lower surface 60Ab, 60Cb, 60Eb, 60Fb, 60Gb) of the surface of the heat conducting plate to which the temperature regulator is attached (e.g., the upper surface 60Aa, 60Ca, 60Ea, 60Fa, 60Ga) is directed to the crystal resonator.

A fifth aspect of the present invention is the thermostatic type crystal oscillator (e.g., the thermostatic type crystal oscillator 1A, 1B, 1C, 1D, 1E) in which, in the third or fourth aspect, the base includes a mounting surface (e.g., the mounting surface 311A1a, 311A2a, 311E1a, 311E2a) on which the crystal resonator is mounted and an abutting surface (e.g., the abutting surface 311A1b, 311A2b, 311E1b, 311E2b) on which the heat conducting plate abuts.

A sixth aspect of the invention is the thermostatic type crystal oscillator in which, in the fifth aspect, when viewed from a front-back direction of the cover, the abutting surface is disposed on an outer side of the mounting surface.

A seventh aspect of the present invention is the thermostatic type crystal oscillator (e.g., the thermostatic type crystal oscillator 1A, 1B, 1C, 1D) in which, in the fifth or sixth aspect, in a front-back direction of the cover, the abutting surface (e.g., the abutting surface 311A1b, 311A2b) is disposed closer to the cover side than the mounting surface (e.g., the mounting surface 311A1a, 311A2a).

An eighth aspect of the present invention is the thermostatic type crystal oscillator (e.g., the thermostatic type crystal oscillator 1A, 1C) in which, in the seventh aspect, in the front-back direction, a distance between the cover and the crystal resonator (e.g., the distance "L1") is larger than a distance between the cover and the abutting surface (e.g., the distance "L2").

A ninth aspect of the present invention is the thermostatic type crystal oscillator (e.g., the thermostatic type crystal oscillator 1B, 1D, 1G) in which, in any one of the second to seventh aspects, the heat conducting plate (e.g., the heat conducting plate 60A, 60C, 60G) abuts on the crystal blank (e.g., the crystal blank 11A, 11C, 11G).

A tenth aspect of the present invention is the thermostatic type crystal oscillator (e.g., the thermostatic type crystal oscillator 1B, 1D) in which, in the ninth aspect, the crystal blank includes a thick portion (e.g., the thick portion 11A1, 11C1) and a thin portion thinner than the thick portion (e.g., the thin portion 11A2, 11C2), and the heat conducting plate abuts on the thick portion.

An eleventh aspect of the present invention is the thermostatic type crystal oscillator (e.g., the thermostatic type crystal oscillator 1A, 1B, 1C, 1D, 1E, 1F) in which, in any one of the second to eighth aspects, the heat conducting plate faces the crystal resonator with a gap (e.g., the gap Si, SB1, SC1, SD1, SE1, SF1) interposed between the heat conducting plate and the crystal resonator.

A twelfth aspect of the present invention is the thermostatic type crystal oscillator (e.g., the thermostatic type crystal oscillator 1G) in which, in the second or third aspect, the temperature regulator (e.g., the temperature regulator 50G) is mounted on the crystal blank (e.g., the crystal blank 11G).

A thirteenth aspect of the present invention is the thermostatic type crystal oscillator (e.g., the thermostatic type crystal oscillator 1) in which, in the first aspect, the housing (e.g., the housing 30) includes a base (e.g., the base 31) having an opening portion (e.g., the opening portion 31a) and on which the crystal resonator (e.g., the crystal resonator 10) is mounted, and a cover (e.g., the cover 32) that seals the opening portion; the cover includes a front surface (e.g., the upper surface 32a) that faces external environmental space of the housing and a back surface (e.g., the lower surface 32b) that faces the resonator accommodating space (e.g., the resonator accommodating space 31c); and one surface (e.g., the lower surface 50b) of the temperature regulator (e.g., the temperature regulator 50) is attached to the front surface of the cover and another surface (e.g., the upper surface 50a) of the temperature regulator is attached to the heat conducting plate (e.g., the heat conducting plate 60).

A fourteenth aspect of the present invention is the thermostatic type crystal oscillator (e.g., the thermostatic type crystal oscillator 1H) in which, in the first aspect, the housing (e.g., the housing 30H) includes a first opening portion (e.g., the first opening portion 316Ha) and a second opening portion (e.g., the second opening portion 316Hb), and includes a base (e.g., the base 31H) in which the crystal resonator (e.g., the crystal resonator 10A) is accommodated, a first cover (e.g., the first cover 32H) that seals the first opening portion, and a second cover (e.g., the second cover 33H) that seals the second opening portion; and the temperature regulator (e.g., the temperature regulator 50H) is attached to the first cover.

A fifteenth aspect of the present invention is the thermostatic type crystal oscillator in which, in the fourteenth aspect, the first cover includes a front surface (e.g., the lower surface 32Hb) that faces external space of the housing and a back surface (e.g., the upper surface 32Ha) that faces the resonator accommodating space (e.g., the resonator accommodating space 31Hc); the temperature regulator is attached to the front surface of the first cover; and the crystal resonator is mounted on the back surface of the first cover.

A sixteenth aspect of the present invention is the thermostatic type crystal oscillator in which, in any one of the first to fifteenth aspects, an atmosphere of the resonator accommodating space is a vacuum atmosphere.

A seventeenth aspect of the present invention is the thermostatic type crystal oscillator in which, in any one of the first to sixteenth aspects, the housing accommodates the vibration control circuit and the temperature control circuit.

An eighteenth aspect of the present invention is the thermostatic type crystal oscillator in which, in the seventeenth aspect, the housing defines, inside the housing, a circuit accommodating space in which the vibration control circuit and the temperature control circuit are accommodated, and the resonator accommodating space is isolated from the circuit accommodating space.

A nineteenth aspect of the present invention is the thermostatic type crystal oscillator in which, in any one of the first to eighteenth aspect, the temperature range is set within a range of 30° C. to 50° C.

A twentieth aspect of the present invention is the thermostatic type crystal oscillator in which, in the nineteenth aspect, the temperature range is set within a range of 35° C. to 45° C.

A twenty-first aspect of the present invention is the thermostatic type crystal oscillator including, in any one of the first to twentieth aspect, an extraction circuit (e.g., the extraction circuit 23) configured to extract a B-mode signal of the crystal resonator, in which the temperature control circuit controls a current flowing through the temperature regulator, based on the B-mode signal.

A twenty-second aspect of the present invention is the thermostatic type crystal oscillator (e.g., the thermostatic type crystal oscillator 1, 1A, 1B, 1C, 1D, 1E, 1F, 1G, 1H) including a crystal resonator (e.g., the crystal resonator 10, 10A, 10C, 10G) that includes an IT-cut crystal blank (e.g., the crystal blank 11, 11A, 11C, 11G); a vibration control circuit (e.g., the vibration control circuit 22) configured to control a vibration frequency of the crystal resonator; a temperature regulator (e.g., the temperature regulator 50, 50A, 50C, 50G, 50H) configured to regulate a temperature of the crystal resonator within a predetermined temperature by repeating heating and cooling to the crystal resonator; a temperature control circuit (e.g., the temperature control circuit 24) configured to control a temperature of the temperature regulator; and a housing (e.g., the housing 30, 30A, 30E, 30F, 30H) configured to accommodate the crystal resonator.

A twenty-third aspect of the present invention is the thermostatic type crystal oscillator (e.g., the thermostatic type crystal oscillator 1, 1H) in which, in the twenty-second aspect, the temperature regulator (e.g., the temperature regulator 50, 50H) is disposed on an outer side of the housing (e.g., the housing 30, 30H).

A twenty-fourth aspect of the present invention is the thermostatic type crystal oscillator including, in the twenty-third aspect, a heat dissipating plate (e.g., the heat dissipating plate 60, 60H) that abuts on the temperature regulator and is configured to radiate heat from the temperature regulator.

A twenty-fifth aspect of the present invention is the thermostatic type crystal oscillator (e.g., the thermostatic type crystal oscillator 1A, 1B, 1C, 1D, 1E, 1F, 1G) in which, in the twenty-second aspect, the temperature regulator (e.g., the temperature regulator 50A, 50C, 50F, 50G) is disposed inside the housing.

A twenty-sixth aspect of the present invention is the thermostatic type crystal oscillator (e.g., the thermostatic type crystal oscillator 1A, 1B, 1C, 1D, 1E, 1F) in which, in the twenty-fourth or twenty-fifth aspect, the housing includes a base (e.g., the base 31A, 31E, 31F, 31G) on which the crystal resonator is installed (mounted), and a cover (e.g., the cover 32) that seals an opening (e.g., the opening portion 31Aa, 31Ea, 31Fa, 31Ga) of the base, and the temperature regulator abuts on the cover.

A twenty-seventh aspect of the present invention is the thermostatic type crystal oscillator (e.g., the thermostatic type crystal oscillator 1B, 1D, 1G) in which, in the twenty-fifth aspect, the temperature regulator abuts on the crystal blank.

A twenty-eighth aspect of the present invention is the thermostatic type crystal oscillator in which, in any one of the twenty-second to twenty-seventh aspect, the atmosphere inside of the housing is the vacuum atmosphere.

A twenty-ninth aspect of the present invention is the thermostatic type crystal oscillator in which, in any one of the twenty-second to twenty-eighth aspects, the temperature regulator is a peltier element.

A thirtieth aspect of the present invention is the thermostatic type crystal oscillator in which, in the twenty-second aspect, the housing includes an resonator accommodating portion (e.g., the resonator accommodating space 31c, 31Ac, 31Ec, 31Fc, 31Gc, 31Hc) in which the crystal resonator is accommodated and a circuit accommodating portion (e.g., the resonator accommodating space 31c, 31Ac, 31Ec, 31Fc, 31Gc, 31Hc) in which the vibration control circuit and the temperature control circuit are accommodated.

A thirty-first aspect of the present invention is the thermostatic type crystal oscillator in which, in the thirtieth aspect, the resonator accommodating portion is isolated from the circuit accommodating portion.

A thirty-second aspect of the present invention is the thermostatic type crystal oscillator in which, in the twenty-second aspect, the predetermined temperature is set within a range of 30° C. to 50° C.

A thirty-third aspect of the present invention is the thermostatic type crystal oscillator in which, in the thirty-second aspect, the predetermined temperature is set within a range of 35° C. to 45° C.

A thirty-fourth aspect of the present invention is the thermostatic type crystal oscillator including, in the twenty-second aspect, an extraction circuit configured to extract a B-mode signal of the crystal resonator, in which the temperature control circuit is configured to control a current flowing through the temperature regulator, based on the B-mode signal.

A thirty-fifth aspect of the present invention is the thermostatic type crystal oscillator in which, in the twenty-second aspect, the housing has external dimensions with a length of 2.5 mm or less and a width of 2.0 mm or less.

REFERENCE SIGNS LIST

1 Thermostatic type crystal oscillator
10 Crystal resonator
11 Crystal blank
22 Vibration control circuit
23 Extraction circuit
24 Temperature control circuit
30 Housing
31 Base
31a Opening portion
31c Resonator accommodating space
32 Cover
32a Upper surface (Front surface)
32b Lower surface (Back surface)
50 Temperature regulator
50a Upper surface (Another surface)
50b Lower surface (One surface)
60 Heat conducting plate
1A Thermostatic type crystal oscillator
10A Crystal resonator
11A Crystal blank
11A1 Thick portion
11A2 Thin portion
30A Housing
31A Base
31Aa Opening portion
31Ac Resonator accommodating space
331A1a, 331A2a Mounting surface
331A1b, 331A2b Abutting surface
50A Temperature regulator
50Aa Upper surface (One surface)
50Ab Lower surface (Another surface)
60A Heat conducting plate
60Aa Upper surface (Surface to which temperature regulator is attached)
60Ab Lower surface (Opposite side surface)
51 Gap
1B Thermostatic type crystal oscillator
SB1 Gap
1C Thermostatic type crystal oscillator
10C Crystal resonator
11C Crystal blank
11C1 Thick portion
11C2 Thin portion
50C Temperature regulator
50Ca Upper surface (One surface)
50Cb Lower surface (Another surface)
60C Heat conducting plate
60Ca Upper surface (Surface to which temperature regulator is attached)
60Cb Lower surface (Opposite side surface)
SC1 Gap
1D Thermostatic type crystal oscillator
SD1 Gap
1E Thermostatic type crystal oscillator
30E Housing
31E Base
31Ea Opening portion
31Ec Resonator accommodating space
311E1a, 311E2a Mounting surface
311E1b, 311E2b Abutting surface
60E Heat conducting plate
60Ea Upper surface (Surface to which temperature regulator is attached)
60Eb Lower surface (Opposite side surface)
SE1 Gap
1F Thermostatic type crystal oscillator
30F Housing
31F Base
31Fa Opening portion
31Fc Resonator accommodating space
60F Heat conducting plate
60Fa Upper surface (Surface to which temperature regulator is attached)
60Fb Lower surface (Opposite side surface)
1G Thermostatic type crystal oscillator
10G Crystal resonator
11G Crystal blank
30G Housing
31Gc Resonator accommodating space
50G Temperature regulator
60G Heat conducting plate
1H Thermostatic type crystal oscillator
30H Housing
31Hc Resonator accommodating space 315Ha First opening portion
315Hb Second opening portion
32H First cover
32Ha Upper surface (Back surface)
32Hb Lower surface (Front surface)
33H Second cover
50H Temperature regulator

The invention claimed is:

1. A thermostatic type crystal oscillator comprising:
a crystal resonator including an IT-cut crystal blank;
a vibration control circuit configured to control a vibration frequency of the crystal resonator;
a temperature regulator configured to regulate a temperature of the crystal resonator within a set temperature range by repeating heating and cooling to the crystal resonator;
a heat conducting plate configured to function as a heat absorbing plate and a heat dissipating plate for the temperature regulator;
a temperature control circuit configured to control a temperature of the temperature regulator; and
a housing that accommodates the crystal resonator, wherein
the housing defines, inside the housing, a resonator accommodating space in which the crystal resonator is accommodated,
the temperature regulator is a Peltier element configured to be capable of forcibly heating and forcibly cooling the crystal resonator, and
the temperature range is set within a range of 30° C. to 50° C.

2. The thermostatic type crystal oscillator according to claim 1, wherein the temperature regulator and the heat conducting plate are disposed in the resonator accommodating space.

3. The thermostatic type crystal oscillator according to claim 2, wherein
the housing includes:
a base having an opening portion and on which the crystal resonator is mounted; and
a cover that seals the opening portion, wherein the cover includes:
a front surface facing external environmental space of the housing; and
a back surface facing the resonator accommodating space.

4. The thermostatic type crystal oscillator according to claim 3, wherein
one surface of the temperature regulator is attached to the back surface of the cover,
another surface of the temperature regulator is attached to the heat conducting plate, and
an opposite side surface of a surface of the heat conducting plate to which the temperature regulator is attached is directed to the crystal resonator.

5. The thermostatic type crystal oscillator according to claim 4, wherein
the base includes:
a mounting surface on which the crystal resonator is mounted; and
an abutting surface on which the heat conducting plate abuts.

6. The thermostatic type crystal oscillator according to claim 5, wherein, when viewed from a front-back direction of the cover, the abutting surface is disposed on an outer side of the mounting surface.

7. The thermostatic type crystal oscillator according to claim 6, wherein, in a front-back direction of the cover, the abutting surface is disposed closer to the cover side than the mounting surface.

8. The thermostatic type crystal oscillator according to claim 7, wherein, in the front-back direction, a distance between the cover and the crystal resonator is larger than a distance between the cover and the abutting surface.

9. The thermostatic type crystal oscillator according to claim 2, wherein the heat conducting plate abuts on the crystal blank.

10. The thermostatic type crystal oscillator according to claim 9, wherein
the crystal blank includes a thick portion and a thin portion that is thinner than the thick portion, and
the heat conducting plate abuts on the thick portion.

11. The thermostatic type crystal oscillator according to claim 2, wherein the heat conducting plate faces the crystal resonator with a gap interposed between the heat conducting plate and the crystal resonator.

12. The thermostatic type crystal oscillator according to claim 2, wherein the temperature regulator is mounted on the crystal blank.

13. The thermostatic type crystal oscillator according to claim 1, wherein
the housing includes:
a base having an opening portion and on which the crystal resonator is mounted; and
a cover that seals the opening portion, wherein the cover includes:
a front surface facing external environmental space of the housing; and
a back surface facing the resonator accommodating space,
one surface of the temperature regulator is attached to the front surface of the cover, and
another surface of the temperature regulator is attached to the heat conducting plate.

14. The thermostatic type crystal oscillator according to claim 1, wherein
the housing includes:
a base having a first opening portion and a second opening portion and in which the crystal resonator is accommodated;
a first cover that seals the first opening portion; and
a second cover that seals the second opening portion, and the temperature regulator is attached to the first cover.

15. The thermostatic type crystal oscillator according to claim 14, wherein
the first cover includes:
a front surface facing external environmental space of the housing; and
a back surface facing the resonator accommodating space, and
the temperature regulator is attached to the front surface of the first cover, and
the crystal resonator is mounted on the back surface of the first cover.

16. The thermostatic type crystal oscillator according to claim 1, wherein an atmosphere of the resonator accommodating space is a vacuum atmosphere.

17. The thermostatic type crystal oscillator according to claim 1, wherein the housing accommodates the vibration control circuit and the temperature control circuit.

18. The thermostatic type crystal oscillator according to claim 17, wherein the housing defines, inside the housing, a circuit accommodating space in which the vibration control circuit and the temperature control circuit are accommodated, and the resonator accommodating space is isolated from the circuit accommodating space.

19. The thermostatic type crystal oscillator according to claim 1, further comprising an extraction circuit configured to extract a B-mode signal of the crystal resonator, wherein the temperature control circuit is configured to control a current flowing through the temperature regulator, based on the B-mode signal.

\* \* \* \* \*